United States Patent
Montorsi et al.

(10) Patent No.: US 11,082,061 B2
(45) Date of Patent: Aug. 3, 2021

(54) HIGH-RATE LONG LDPC CODES

(71) Applicants: Guido Montorsi, Turin (IT); Sergio Benedetto, Turin (IT); Yan Xin, Ottawa (CA); Min Yan, Shenzhen (CN)

(72) Inventors: Guido Montorsi, Turin (IT); Sergio Benedetto, Turin (IT); Yan Xin, Ottawa (CA); Min Yan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/559,027

(22) Filed: Sep. 3, 2019

(65) Prior Publication Data

US 2019/0393890 A1     Dec. 26, 2019

Related U.S. Application Data

(63) Continuation of application No. PCT/CN2017/075616, filed on Mar. 3, 2017.

(51) Int. Cl.
*H03M 13/00* (2006.01)
*H03M 13/11* (2006.01)
*H03M 13/15* (2006.01)

(52) U.S. Cl.
CPC .... *H03M 13/1157* (2013.01); *H03M 13/1174* (2013.01); *H03M 13/1575* (2013.01); *H03M 13/616* (2013.01)

(58) Field of Classification Search
CPC ........ H03M 13/1157; H03M 13/1174; H03M 13/1576; H03M 13/616
See application file for complete search history.

(56) References Cited

U.S. PATENT DOCUMENTS

| | | |
|---|---|---|
| 7,346,832 B2 | 3/2008 | Richardson et al. |
| 8,433,984 B2 | 4/2013 | Khandekar et al. |
| 8,443,254 B2 | 5/2013 | Chung et al. |
| 8,910,025 B2 | 12/2014 | Pisek |
| 9,160,369 B1 | 10/2015 | Miladinovic |

(Continued)

FOREIGN PATENT DOCUMENTS

| | | |
|---|---|---|
| CN | 101951264 A | 1/2011 |
| CN | 102412842 A | 4/2012 |

(Continued)

OTHER PUBLICATIONS

IEEE 802.11-16/1495-00-00ay-rate-7-8-ldpc-code-for-11ay 2016.

(Continued)

*Primary Examiner* — Samir W Rizk

(57) ABSTRACT

Methods and devices for encoding source words and decoding codewords wherein encoding a source word includes: receiving a 1×K source word row vector $\bar{u}$; and generating a 1×N codeword vector $\bar{c} = \bar{u} \cdot G$, wherein G is a K×N generator matrix derived from a parity check matrix $H_f$; and wherein the parity check matrix $H_f$ is derived from a base parity check matrix H by applying an optimized lifting matrix to the base parity check matrix H.

6 Claims, 27 Drawing Sheets

(56) References Cited

U.S. PATENT DOCUMENTS

| | | | |
|---|---|---|---|
| 2008/0178065 A1* | 7/2008 | Khandekar | H03M 13/1185 714/801 |
| 2009/0204876 A1 | 8/2009 | Costa et al. | |
| 2009/0259915 A1 | 10/2009 | Livshitz et al. | |
| 2012/0084625 A1 | 4/2012 | Pisek et al. | |
| 2013/0139024 A1* | 5/2013 | Nguyen | H03M 13/033 714/752 |
| 2016/0380722 A1 | 12/2016 | Hassanin et al. | |

FOREIGN PATENT DOCUMENTS

| | | |
|---|---|---|
| CN | 104106230 B | 6/2017 |
| EP | 2833553 A1 | 2/2015 |
| JP | 2012505603 A | 3/2012 |
| KR | 20090113869 A | 11/2009 |
| RU | 2438236 C2 | 6/2010 |

OTHER PUBLICATIONS

D. Mackay, "Good Error-Correcting Codes Based on Very Sparse Matrices", IEEE Transactions on Information Theory, vol. 45, Mar. 1999, pp. 399-431 1999.

R. M. Tanner, "A recursive approach to low complexity codes," IEEE Trans. Inform. Theory, vol. 27, pp. 533-547, Sep. 1981 1981.

The 802 11 Working Group of the LAN/MAN Standards Committee of the IEEE Computer Society: "Draft Standard for Information Technology—Telecommunications and Information Exchange Between Systems—Local and Metropolitan Area—Networks—Specific Requirements—Part 11: Wireless LAN Medium Access Control (MAC) and Physical Layer (PHY) Specifications Amendment 7", IEEE Draft; Draft P802.11 AY D0.2, vol. 802.11 ay drafts, No. D0.2 Feb. 9, 2017 (Feb. 9, 2017), pp. 1-193, XP068137600, total 193 pages.

Shadi Abu-Surra et al: "Length 1344 LDPC codes for 11ay", IEEE 802.11-16/0676r1, May 17, 2016 (May 17, 2016), pp. 1-32, XP055538100.

Zongwang Li et al: "Efficient encoding of quasi-cyclic low-density paritycheck codes", IEEE Transactions on Communications, IEEE Service Center, Piscataway, NJ. USA, vol. 54, No. 1, Jan. 1, 2006 (Jan. 1, 2006), pp. 71-81, XP002489550.

Abu-Surra, Shadi et al. Length 1344 LDPC codes for 11ay, IEEE802. 11-16/0676r1. May 2016. total 32 pages.

Xin, Yan et al. Rate 7/8 LDPC Code for 11ay, IEEE802.11-16/1495r1, Nov. 2016. total 25 pages.

Kasher, Assaf:"Additional SC MCSs in clause 20 (DMG PHY)", IEEE802.11-16/0233r0, Feb. 2016. total 12 pages.

Andres I. Vila Casado et al, Multiple-rate low-density parity-check codes with constant blocklength, IEEE Transactions on Communications, vol. 57, No. 1, Jan. 2009, pp. 75-83.

* cited by examiner

FIGURE 5A

Rate-1/2 LDPC code matrix H = 336 rows x 672 columns, Z = 42

FIGURE 5B

Rate-5/8 LDPC code matrix H = 252 rows x 672 columns, Z = 42

Rate-3/4 LDPC code matrix H = 168 rows × 672 columns, Z = 42

| | | | | | | | | | | | | | | | |
|---|---|---|---|---|---|---|---|---|---|---|---|---|---|---|---|
| 35 | 19 | 41 | 22 | 40 | 41 | 39 | 6 | 28 | 18 | 17 | 3 | 28 | | | 24 |
| 29 | 30 | 0 | 8 | 33 | 22 | 17 | 4 | 27 | 28 | 20 | 27 | 24 | 23 | 13 | |
| 37 | 31 | 18 | 23 | 11 | 21 | 6 | 20 | 32 | 9 | 12 | 29 | | 0 | 13 | |
| 25 | 22 | 4 | 34 | 31 | 3 | 14 | 15 | 4 | | 14 | 18 | 13 | 13 | 22 | |

FIGURE 5C

Rate-13/16 LDPC code matrix H = 126 rows × 672 columns, Z = 42

| | | | | | | | | | | | | | | | |
|---|---|---|---|---|---|---|---|---|---|---|---|---|---|---|---|
| 29 | 30 | 0 | 8 | 33 | 22 | 17 | 4 | 27 | 28 | 20 | 27 | 24 | 23 | | 24 |
| 37 | 31 | 18 | 23 | 11 | 21 | 6 | 20 | 32 | 9 | 12 | 29 | 10 | 0 | 13 | 22 |
| 25 | 22 | 4 | 34 | 31 | 3 | 14 | 15 | 4 | 2 | 14 | 18 | 13 | 13 | 22 | |

FIGURE 5D 802.11 ad Rate-3/4 LDPC matrix H (N=672, Z = 42)
850

| | | | | | | | | | | | | | | | |
|---|---|---|---|---|---|---|---|---|---|---|---|---|---|---|---|
| R1 | 35 | 19 | 41 | 22 | 40 | 41 | 39 | 6 | 28 | 18 | 17 | 3 | 28 | | |
| R2 | 29 | 30 | 0 | 8 | 33 | 22 | 17 | 4 | 27 | 28 | 20 | 27 | 24 | 23 | |
| R3 | 37 | 31 | 18 | 23 | 11 | 21 | 6 | 20 | 32 | 9 | 12 | 29 | | 0 | 13 |
| R4 | 25 | 22 | 4 | 34 | 31 | 3 | 14 | 15 | 4 | | 14 | 18 | 13 | 13 | 22 | 24 |

Rate-7/8 LDPC matrix Hn (N=672)
860

| | | | | | | | | | | | | | | | |
|---|---|---|---|---|---|---|---|---|---|---|---|---|---|---|---|
| R3+R1 | 37+35 | 31+19 | 18+41 | 23+22 | 11+40 | 21+41 | 6+39 | 20+6 | 32+28 | 9+18 | 12+17 | 29+3 | -+28 | 0+- | 13+- | -+- |
| R4+R2 | 25+29 | 22+30 | 4+0 | 34+8 | 31+33 | 3+22 | 14+17 | 15+4 | 4+27 | -+28 | 14+20 | 13+24 | 18+27 | 13+23 | 22+- | 24+- |

Optimized Lifting Matrix 1210

FIGURE 13

Optimized Lifting Matrix 1410

| 1 | 1 | 0 | 0 | 1 | 1 | 1 | 0 | 1 | 1 | 1 | 0 | 0 | 0 | 1 | 0 |
|---|---|---|---|---|---|---|---|---|---|---|---|---|---|---|---|
| 0 | 0 | 1 | 0 | 1 | 0 | 1 | 1 | 1 | 1 | 0 | 1 | 0 | 1 | 0 | 0 |

FIGURE 14

HIGH-RATE LONG LDPC CODES

RELATED APPLICATIONS

The present application is continuation of, and claims priority to and the benefit of, International Patent application No. PCT/CN2017/075616 filed Mar. 3, 2017, the contents of which are incorporated herein by reference.

TECHNICAL FIELD

The present application relates to mobile air interface technologies, in particular to methods and systems for encoding and decoding for binary low density parity check (LDPC) codes.

BACKGROUND

An LDPC encoder at a transmitter is used for encoding source words to generate codewords. An LDPC decoder at a receiver is used for decoding the received codewords. LDPC codes of various rates have been adopted in the IEEE 802.11ad standard and are currently proposed in respect of the developing IEEE 802.11ay standard. To date, the long LDPC codes proposed for the 7/8 LDPC code rate have a different codeword length from than the codeword lengths used for different code rates for long LDPC codes. However, the use of different LDPC codeword length for different code rates for long LDPC codes can impact the implementation of the blocking and de-blocking processes at the transmitter and at the receiver respectively. Accordingly, it is desirable to have a codeword length that is consistent for different code rates.

SUMMARY

According to example embodiments a new high rate, long LDPC code is provided, including a rate 7/8 (1344, 1176) LDPC code that preserves the codeword length of 1344 that is used by other LDPC codes that have different code rates, so as to simplify the implementation and increase spectrum efficiency with padding fewer zeros in encoding and single carrier (SC) blocking compared to other possible solutions.

According to an example aspect is a method and system for encoding a source word, comprising: receiving a 1×K source word row vector $\bar{u}$; and generating a 1×N codeword vector $\bar{c} = \bar{u} \cdot G$, wherein G is a K×N generator matrix derived from a parity check matrix $H_I$; and wherein $H_I$ is derived from a base parity check matrix H by applying an optimized lifting matrix to the base parity check matrix $H_I$ the optimized lifting matrix being either:

| 1 | 1 | 0 | 0 | 0 | 0 | 0 | 1 | 1 | 0 | 1 | 0 | 0 |   |
|---|---|---|---|---|---|---|---|---|---|---|---|---|---|
| 1 | 0 | 0 | 1 | 1 | 1 | 1 | 1 | 1 | 1 | 1 | 0 | 1 | 1 |
| 0 | 0 | 1 | 1 | 1 | 1 | 0 | 0 | 1 | 0 | 1 |   | 0 | 1 |
| 0 | 1 | 1 | 0 | 0 | 0 | 0 | 0 |   | 0 | 1 | 0 | 0 | 0 | 0 | or:

| 0 | 0 | 0 | 0 | 1 | 1 | 0 | 0 | 0 | 1 | 0 | 0 | 1 |   |
|---|---|---|---|---|---|---|---|---|---|---|---|---|---|
| 1 | 1 | 0 | 0 | 1 | 0 | 1 | 0 | 1 | 0 | 0 | 0 | 0 | 1 |
| 0 | 1 | 1 | 0 | 1 | 1 | 0 | 0 | 1 | 0 | 0 |   | 1 | 0 |
| 0 | 1 | 0 | 1 | 0 | 0 | 0 | 0 |   | 0 | 0 | 0 | 0 | 0 | 1 |

In some examples, different rows in the intermediate base parity check matrix are summed to obtain $H_I$. In some examples, $H_I$ is:

| 37 | 35 | 31 | 19 | 41 | 18 | 22 | 23 | 40 | 11 | 41 | 21 | 39 | 6  | 20 | 6  | 32 | 28 | 18 |
|----|----|----|----|----|----|----|----|----|----|----|----|----|----|----|----|----|----|----|
| 35 | 37 | 19 | 31 | 18 | 41 | 23 | 22 | 11 | 40 | 21 | 41 | 6  | 39 | 6  | 20 | 28 | 32 | 9  |
| 25 | 29 | 30 | 22 | 0  | 4  | 34 | 8  | 31 | 33 | 3  | 22 | 14 | 17 | 15 | 4  | 4  | 27 |    |
| 29 | 25 | 22 | 30 | 4  | 0  | 8  | 34 | 33 | 31 | 22 | 3  | 17 | 14 | 4  | 15 | 27 | 4  | 28 |

|   |   |   |   | 9  | 12 | 17 | 3  | 29 | 28 |    | 0  |    | 13 |    |    |    |    |    |
|---|---|---|---|----|----|----|----|----|----|----|----|----|----|----|----|----|----|----|
|   |   |   |   | 18 | 17 | 12 | 29 | 3  |    | 28 |    | 0  | 13 |    |    |    |    |    |
|   |   |   |   | 28 | 14 | 20 | 27 | 18 | 13 | 24 | 13 | 23 | 22 |    | 24 |    |    |    |
|   |   |   |   | 20 | 14 | 18 | 27 | 24 | 13 | 23 | 13 |    | 22 |    | 24 |    |    |    |

According to an example aspect a method for encoding a source word is provided comprising: receiving a 1×K source word row vector $\bar{u}$; and generating a 1×N codeword vector $\bar{c} = \bar{u} \cdot G$, wherein G is a K×N generator matrix derived from a parity check matrix $H_f$; and wherein $H_f$ is derived from a base parity check matrix H by summing different rows in the base parity check matrix H to obtain an intermediate parity check matrix, and applying a lifting matrix to the intermediate base parity check matrix to obtain $H_f$.

According to an example aspect, a method for encoding a source word is provided, comprising: receiving a 1×K source word row vector $\bar{u}$; and generating a 1×N codeword vector $\bar{c} = \bar{u} \cdot G$, wherein G is a K×N generator matrix derived from a parity check matrix $H_f$; and wherein $H_f$ is derived from a base parity check matrix H by increasing a lifting factor applied to the base parity check matrix H to obtain an extended base parity check matrix, and summing different rows in the extended base parity check matrix to obtain $H_f$.

BRIEF DESCRIPTION OF THE DRAWINGS

Reference will now be made, by way of example, to the accompanying figures which show example embodiments of the present application, and in which:

FIGS. 5A-5D are partitioned LDPC parity check matrices specified in IEEE802.11ad with codeword length of 672.

FIG. 8 illustrates a short length LDPC matrix $H_n$ of code rate 7/8 based on rate 3/4 LDPC in 802.11;

FIG. 11 illustrates another example of a further method for generating a length 1344 LDPC matrix $H_f$ of code rate 7/8 based on rate 3/4 LDPC in 802.11 according to the present disclosure;

FIG. 12 shows an alternative lifting matrix for use in the method of FIG. 11;

FIG. 13 illustrates yet another example of a further method for generating a length 1344 LDPC matrix $H_f$ of code rate 7/8 based on rate 3/4 LDPC in 802.11 according to the present disclosure;

FIG. 14 shows an alternative lifting matrix for use in the method of FIG. 13;

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

The present disclosure teaches methods, devices, and systems for encoding source words and decoding codewords in a wireless network. While described below primarily with respect to 802.11ay compatible networks, the present disclosure may also be applied to other blocking coding based systems.

Long LDPC codewords having a length of 1344 bits for lower code rates 1/2, 5/8, 3/4 and 13/16 can be generated based on two-step lifting of the corresponding 672 bit LDPC codewords specified in IEEE 802.11ad. However, there remains the need for suitable a higher rate LDPC code, such as a 7/8 rate code, that uses a long codeword that is the same length as lower rate long code word such as 1344 bits. In this regard, the present disclosure describes a high rate, long LDPC code, such as a 7/8 rate LDPC code having a 1344 bit-long codeword.

By way of context, submissions relating to LDPC codes in respect of development of the 802.11ay standard include "IEEE 802.11-16/0676-01-00ay-length-1344-LDPC-codes-for-11ay" [REF 1] and "IEEE 802.11-16/1495-00-00ay-rate-7-8-ldpc-code-for-11ay" [REF 2]. [REF 1] proposes a rate 7/8 long LDPC code generated by puncturing the first 96 parity bits of the rate 13/16 LDPC codewords of length 1344 bits. However, this puncturing process applied to the length-1344 LDPC code results in a rate 7/8 LDPC code with a codeword length of 1248 bits, as compared to the 1344 codeword length of the lower rate LDPC codes. Different LDPC codeword sizes will impact on the implementation of encoding and single carrier (SC) blocking (mapping symbols to blocks) at the transmitter and receiver. Accordingly, it is desirable that the codeword length for different code rates be kept the same.

[REF 2] proposes a high rate (7/8) short LDPC code with a codeword length of 672 bits that preserves the expansion factor of 42 and codeword length of 672 unchanged from those specified for the lower rate codes in 802.11ad [3]. The present disclosure describes a high rate long LDPC code that is implemented using a codeword length that can also be applied to lower rate codes.

Figure 1A:
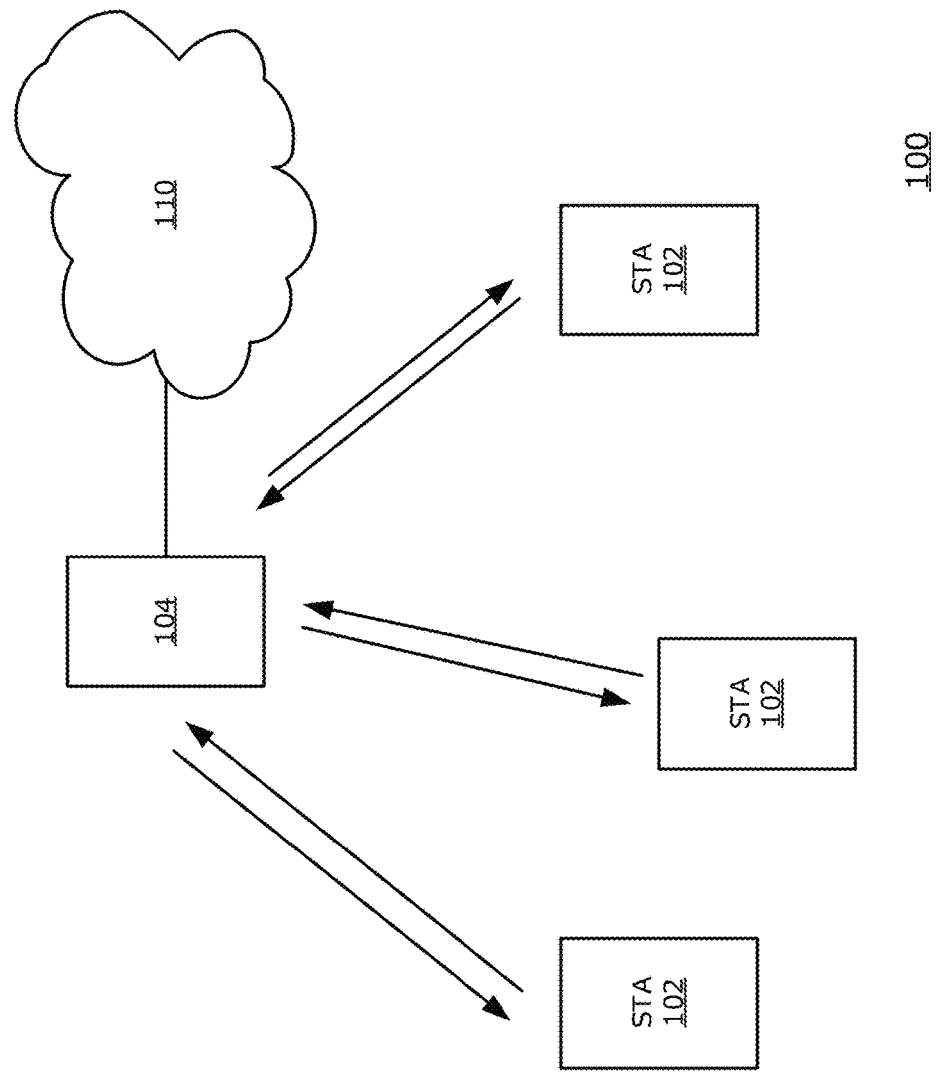
FIG. 1A is a block diagram illustrating an example communications system in accordance with one implementation of the present disclosure.

An example of an environment in which the LDPC coding systems described in detail below can operate will be provided with reference to FIGS. 1A and 1B. FIG. 1A illustrates a communications network 100 comprising a plurality of stations (STAs) 102 and an access point (AP) 104. Each of the STA 102 and AP 104 may include a transmitter, a receiver, an encoder, and/or a decoder as described herein. The network 100 may operate according to one or more communications or data standards or technologies including but not limited to IEEE 802.11 networks, fifth generation (5G) or fourth generation (4G) telecommunications networks, Long-Term Evolution (LTE), 3rd Generation Partnership Project (3GPP), Universal Mobile Telecommunications System (UMTS) and other wireless or mobile communications networks. The STA 102 generally can be any device capable of providing wireless communications or using the 802.11 protocol. The STA 102 may be a laptop, a desktop PC, PDA, access point or Wi-Fi phone, wireless transmit/receive unit (WTRU), mobile station (MS), mobile terminal, smartphone, cellular telephone, or other wireless enabled computing or mobile device. In some embodiments, the STA 102 comprises a machine which has the capability to send, receive, or send and receive data in the communications network 100 but which performs primary functions other than communications. In one embodiment, a machine includes an apparatus or device with means to transmit and/or receive data through the communications network 100 but such apparatus or device is not typically operated by a user for the primary purpose of communications. The AP 104 may comprise a base station (BS), evolved Node B (eNB), wireless router, or other network interface, which functions as a wireless transmission and/or reception point for STA 102 in the network 100. The AP 104 is connected to a backhaul network 110 which enables data to be exchanged between the AP 104 and other remote networks, nodes, APs, and devices (not shown). The AP 104 may support communications with each STA 102 by establishing uplink and downlink communications channels with each STA 102, as represented by the arrows in FIG. 1A. Communications in the network 100 may be unscheduled, scheduled by the AP 104 or by a scheduling or management entity (not shown) in the network 100, or a mix of scheduled and unscheduled communications.

Figure 1B:
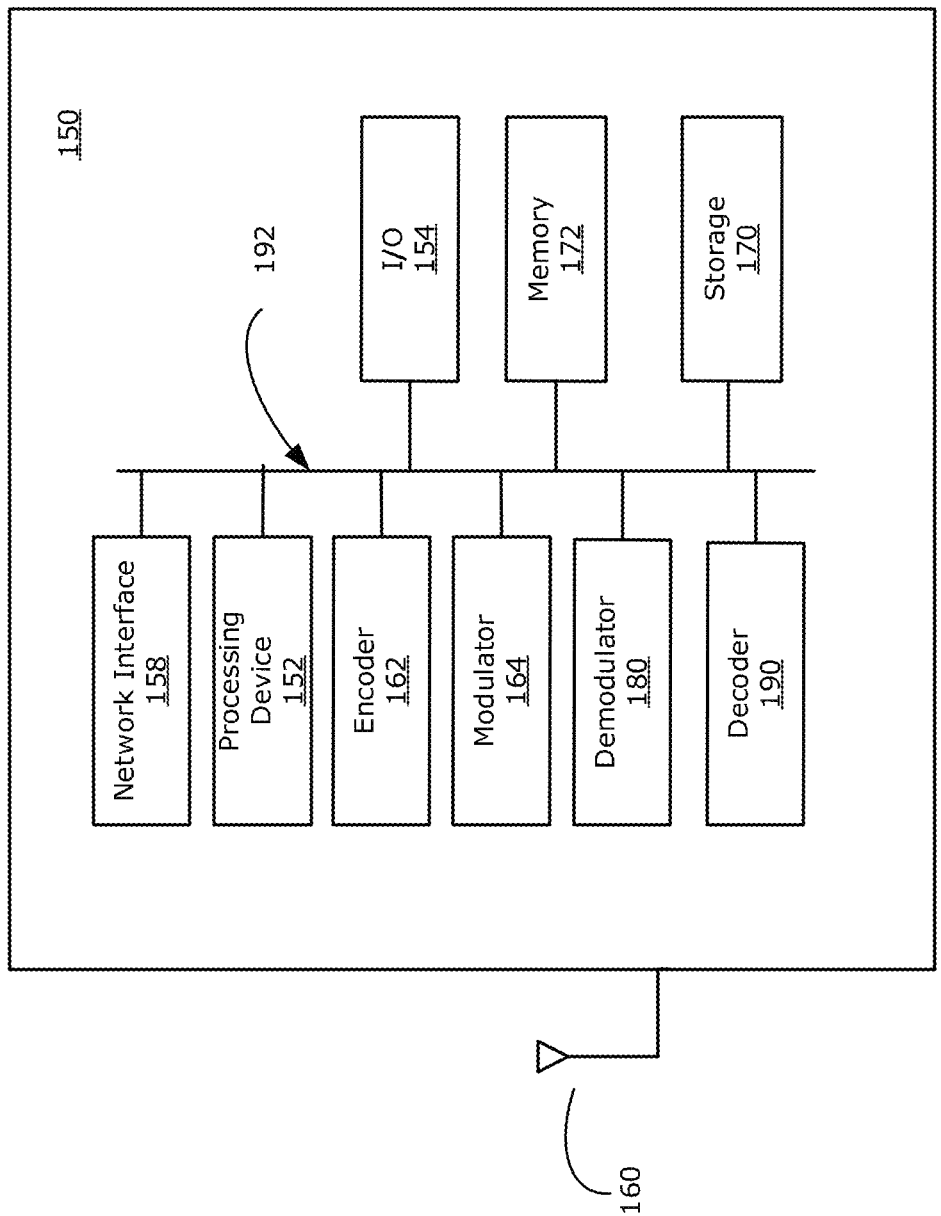
FIG. 1B is a block diagram illustrating an example processing system in accordance with one implementation of the present disclosure.

FIG. 1B illustrates an example processing system 150, which may be used to implement methods and systems described herein, such as the STA 102 or the AP 104. The processing system 150 may be a base station, a wireless router, a mobile device, for example, or any suitable processing system. Other processing systems suitable for implementing the present disclosure may be used, which may include components different from those discussed below. Although FIG. 1B shows a single instance of each component, there may be multiple instances of each component in the processing system 150.

The processing system 150 may include one or more processing devices 152, such as a processor, a microprocessor, an application-specific integrated circuit (ASIC), a field-programmable gate array (FPGA), a dedicated logic circuitry, or combinations thereof. The processing system 150 may also include one or more input/output (I/O) interfaces 154, which may enable interfacing with one or more appropriate input devices and/or output devices (not shown). One or more of the input devices and/or output devices may be included as a component of the processing system 150 or may be external to the processing system 150. The processing system 150 may include one or more network interfaces 158 for wired or wireless communication with a network, such as but not limited to, an intranet, the Internet, a P2P network, a WAN, LAN, a WLAN and/or a cellular or mobile communications network such as a 5G, 4G, LTE or other network as noted above. The network interface(s) 208 may include wired links (e.g., Ethernet cable) and/or wireless links (e.g., one or more radio frequency links) for intra-network and/or inter-network communications. The network interface(s) 158 may provide wireless communication via one or more transmitters or transmitting antennas, one or more receivers or receiving antennas, and various signal processing hardware and software, for example. In this example, a single antenna 160 is shown, which may serve as both transmitting and receiving antenna. However, in other examples there may be separate antennas for transmitting and receiving. The network interface(s) 158 may be configured for sending and receiving data to the backhaul network 110 or to other user devices, access points, reception points, transmission points, network nodes, gateways or relays (not shown) in the network 100.

The processing system 150 may also include one or more storage units 170, which may include a mass storage unit such as a solid state drive, a hard disk drive, a magnetic disk drive and/or an optical disk drive. The processing system 150 may include one or more memories 172, which may include a volatile or non-volatile memory (e.g., a flash memory, a random access memory (RAM), and/or a read-only memory (ROM)). The non-transitory memory(ies) 172 may store instructions for execution by the processing device(s) 152, such as to carry out the present disclosure. The memory(ies) 172 may include other software instructions, such as for implementing an operating system and other applications/functions. In some examples, one or more data sets and/or module(s) may be provided by an external memory (e.g., an external drive in wired or wireless communication with the processing system 150) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

In example embodiments the processing system 150 includes an encoder 162 for encoding source words to codewords and a modulator 164 for modulating codewords to symbols. As explained below, the encoder 162 performs LDPC encoding on source words to generate codewords in bits. The modulator 164 performs modulation on the codewords (e.g., by modulation techniques such as BPSK, QPSK, 16QAM, or 64QAM). In some examples, instructions coded in the memory 172 may configure processing device 152 to perform the functions of the encoder 162 and/or the modulator 164, such that the encoder 162 and/or the modulator 164 may not be distinct physical modules of the processing system 150. In some examples, the encoder 162 and the modulator 164 may be embodied within a transmitter module in the processing system 150. In some examples, the transmitting antenna 160, the encoder 162, and the modulator 164 may be embodied as a transmitter component external to the processing system 150, and may simply communicate the source words from the processing system 150.

The processing system 150 may include a demodulator 180 and a decoder 190, for processing a received signal. The demodulator 180 may perform demodulation on a received modulated signal (e.g., a BPSK, QPSK, 16QAM, or 64QAM signal). The decoder 190 may then perform appropriate decoding on the demodulated signal, in order to recover the original signal contained in the received signal. In some examples, instructions coded in the memory 172 may configure processing device 152 to perform the functions of the demodulator 180 and/or the decoder 190, such that the demodulator 180 and/or the decoder 190 may not be distinct physical modules of the processing system 150. In some examples, the demodulator 180 and the decoder 190 may be embodied within a receiver module in the processing system 150. In some examples, the receiving antenna 160, demodulator 180 and decoder 190 may be embodied as a receiver component external to the processing system 150, and may simply communicate the signal decoded from the received signal to the processing system 150.

There may be a bus 192 providing communication among components of the processing system 150, including the processing device(s) 152, I/O interface(s) 154, network interface(s) 158, encoder 162, modulator 164, storage unit(s) 170, memory(ies) 172, demodulator 180 and decoder 190. The bus 192 may be any suitable bus architecture including, for example, a memory bus, a peripheral bus or a video bus.

Communications between the STA 102 and the AP 104 in the network 100 may be implemented by encoding source words to be transmitted using low density parity check (LDPC) encoding techniques, and/or by decoding codewords received using LDPC code decoding techniques. After source words are encoded with LDPC encoding techniques, when the encoded codewords are transmitted in a signal from the AP 104 to the STA 102 or from the STA 102 to the AP 104, the LDPC encoding information of the transmitted signal may be included in the frame transmitted. After the transmitted signal is received by the STA 102 or the AP 104, with the LDPC encoding information of the received signal, the STA 102 or the AP 104 may then select appropriate LDPC decoding technologies to decode the received signal.

Transmitter and Encoder

Figure 2A:
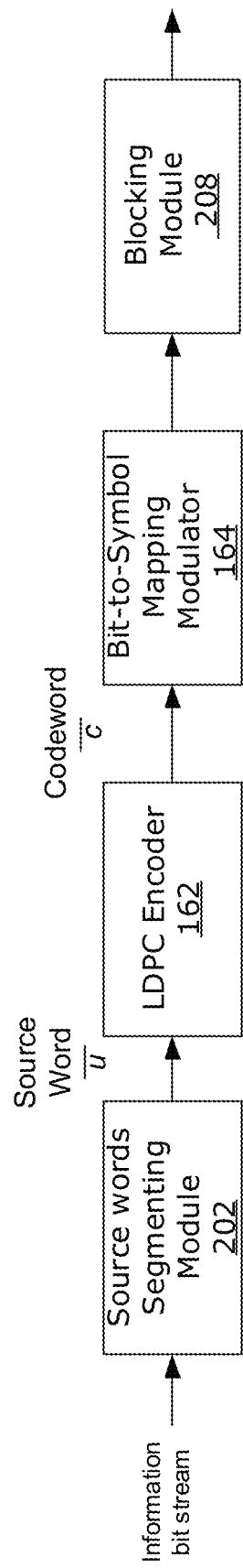
FIG. 2A is a block diagram representing an example implementation of a transmitter of the present disclosure.

FIG. 2A represents an example implementation of a transmitter of the STA 102 or the AP 104. The transmitter may include a source words segmenting module 202, a LDPC encoder 162, a bit-to-symbol mapping modulator 164, and a blocking module 208.

Figure 2B:
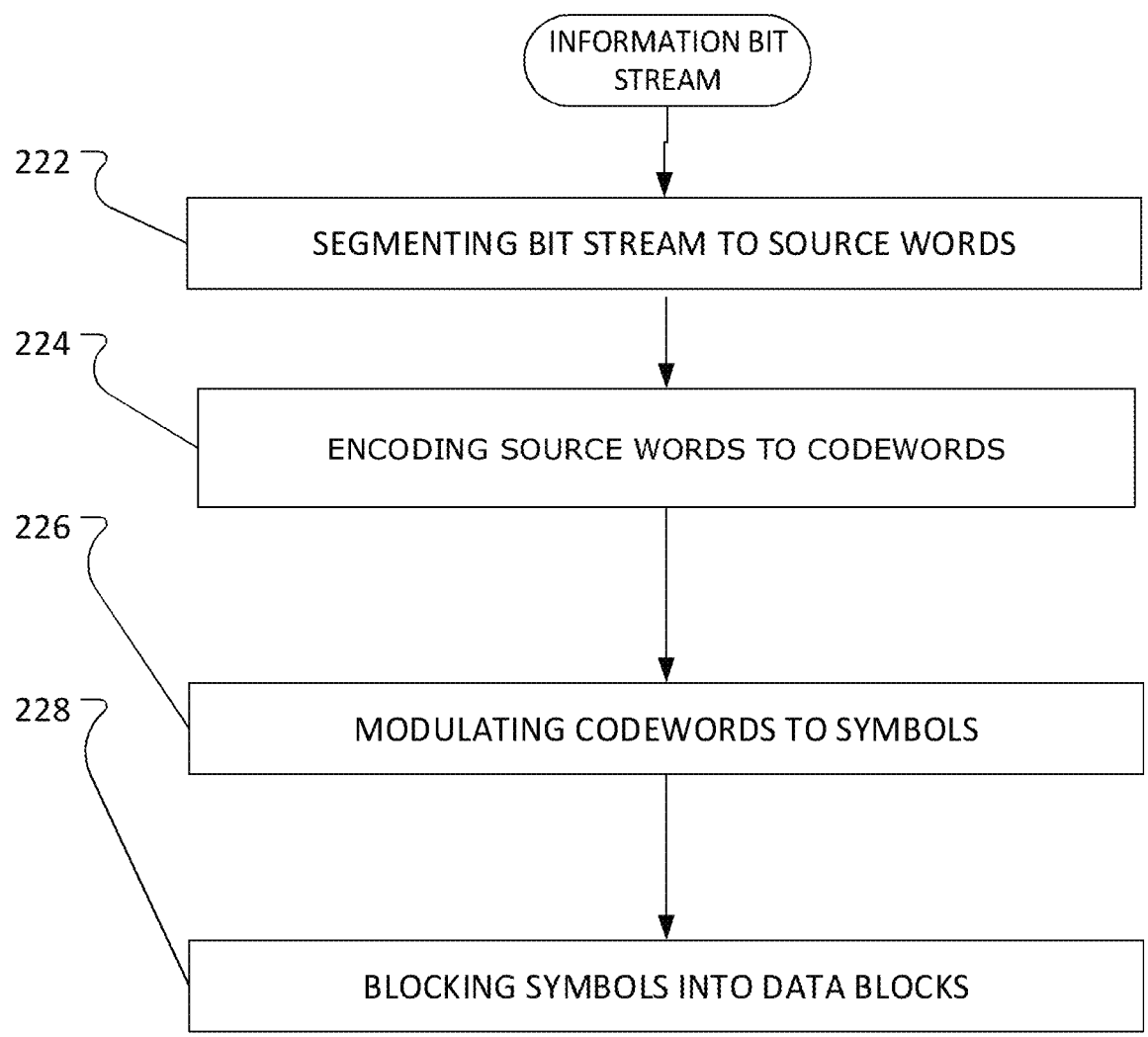
FIG. 2B is a block diagram illustrating example steps in a method of processing information bit stream of the present disclosure.

FIG. 2B illustrates example steps of processing input information bit stream by the transmitter.

The source words segmenting module 202 may be used to segment the input information bit streams into source words $\bar{u}$ with appropriate sizes (step 222). For example, with the source words segmenting module 202, the input information bit streams may be segmented into source words $\bar{u}$ with sizes of 1176 bits in the case of an LDPC 7/8 code rate with LDPC codeword size of 1344 bits.

A source word $\bar{u}$ of K bits may be considered as a 1×K row vector or a one-dimensional binary 1×K matrix $\bar{u}=[u_1 \ldots, u_k]$. For example, a 1176 bit source word may be considered as a 1×1176 row vector or a one-dimensional binary 1×1176 matrix.

Figure 3:
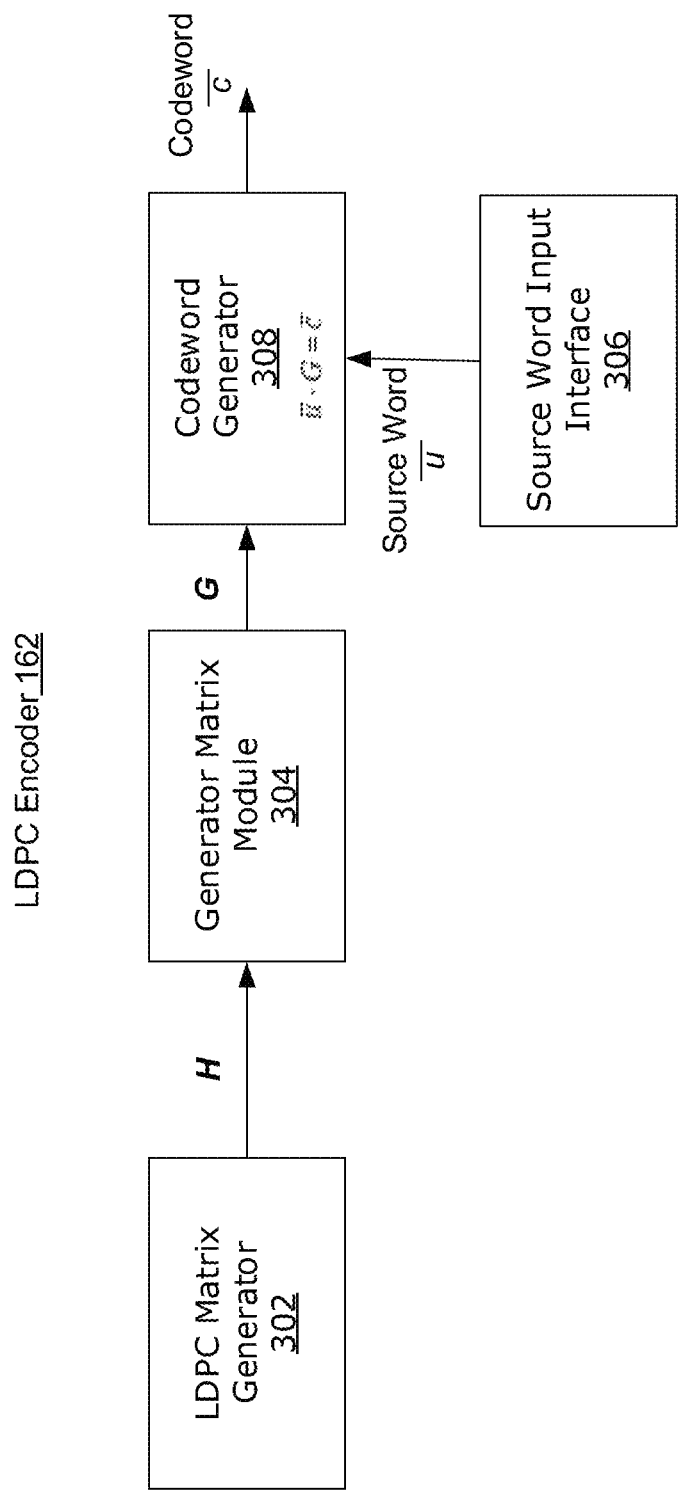
FIG. 3 is a block diagram representing an example implementation of an LDCP encoder of the present disclosure.

The K-bit source words $\bar{u}$ are then encoded to N-bit codewords c by LDPC encoder 162 (step 224). FIG. 3 represents an example implementation of the LDPC encoder 162. In an embodiment, the LDPC encoder 162 may include a LDPC matrix generator 302, a generator matrix module 304, a source word input interface 306, and a codeword generator 308.

The LDPC matrix generator 302 is used to generate a LDPC parity check matrix H, which is a binary (N−K)×N matrix, for example N=1344, K=1176. LDPC codes functionally are defined by a sparse parity-check matrix. An (n, k) LDPC code is a linear binary block code C with a k-dimensional subspace of $\{0, 1\}^n$. Using Gaussian elimination and reordering of columns can result in an equivalent parity-check matrix in systematic form $H=[P_{(n-k)\times k} I_{(n-k)}]$, where $P_{(n-k)\times k}$ is a binary matrix and $I_{(n-k)}$ is the identify matrix of order n−k.

Based on LDPC parity check matrix H generated by the LDPC matrix generator 302, the generator matrix module 304 generates a generator matrix G. The generator matrix G in systematic form which is correspondent to H can be represented as $G=[I_k P^T]$, where "T" denotes the matrix transpose. The generator matrix G is a binary K×N matrix. The row space of G is orthogonal to H such that $GH^T=0$. Therefore, in LDPC encoding, once H has been designed, G can also be determined accordingly. As well, the matrix H satisfies $H\bar{c}^T=0$, where $\bar{c}=[c_1, \ldots, c_n]$ is a codeword of N bits. The generator matrix module 304 then forwards the generated binary (K×N) generator matrix G to the codeword generator 308.

The source word input interface 306 receives the source words from the source words segmenting module 202. As discussed previously, the received source word may be considered as a row vector $\bar{u}=[u_1, \ldots, u_K]$. The source word input interface 306 is forwards the received source words to the codeword generator 308. With the source word $\bar{u}=[u_1, \ldots, u_k]$ and the binary (K×N) generator matrix G, by multiplying the source word with the generator matrix G, $\bar{u}\cdot G=\bar{c}$, the codeword generator 308 generates codewords of N bits $\bar{c}=[c_1, \ldots, c_N]$.

In one embodiment, the generator matrix G may be pre-stored in the LDPC encoder 162. After the source words $\bar{u}=[u_1, \ldots, u_K]$ have been received by the codeword generator 308, the codeword generator 308 may generate codewords $\bar{u}\cdot G=\bar{c}$, $\bar{c}=[c_1, \ldots, c_N]$, without re-generating the LDPC matrix H or the generator matrix G.

Referring to FIGS. 2A and 2B, the encoded codewords $\bar{c}$ are modulated to symbols at bit-to-symbol mapping modulator 164 (step 226). Suitable modulation techniques may be, but are not limited to, BPSK, QPSK, 16QAM, or 64QAM. BPSK, QPSK and 16QAM modulations are specified in 802.11ad. 64QAM modulation is adopted in 802.11ay. In BPSK modulation, binary bits are simply mapped to be bipolar $\{-1, 1\}$ symbols. In QPSK, 16QAM and 64QAM modulations, the input encoded bit streams (codewords $\bar{c}$ in bits) are grouped into sets of 2, 4 and 6 bits, respectively. Each set of bits is mapped to a symbol on the corresponding constellations. For example, for BPSK, QPSK, 16QAM, and 64QAM, a symbol represents 1 bit, 2 bits, 4 bits, and 6 bits, respectively. A plurality of the symbols may be grouped as a modulated codewords. For example, the modulated codewords for the 802.11ad codes of size 672 may include 336 symbols (for single carrier (SC) QPSK blocking in 802.11 ad), 168 symbols (for SC 16QAM blocking in 802.11ad), 112 symbols (for SC 64QAM blocking in 802.11ad).

The modulated codewords may be further assembled into data blocks (BLKs) with appropriate size in the blocking module 208 (step 228). In an embodiment, the assembled data blocks may contain 448 symbols.

Figure 4A:
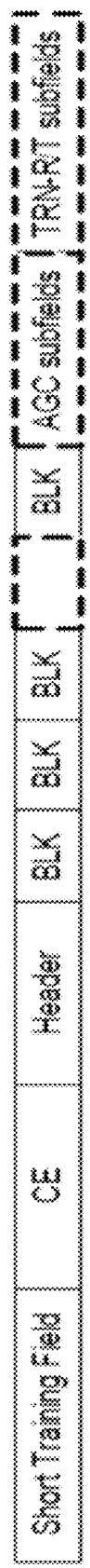
FIG. 4A is a diagram illustrating an example single carrier frame format of 802.11ad.

FIG. 4A illustrates an example single carrier (SC) data unit or frame structure that can be used to package assembled data blocks (BLKS). The illustrated frame, which is specified in IEEE 802.11ad, includes short training field (STF), channel estimation (CE) field, PHY Header, SC data blocks (BLKs) and optional automatic gain control (AGC) and TRN-R/T subfields for beam forming training. The frame may include a plurality BLKs, as shown in FIG. 4A.

Figure 4B:
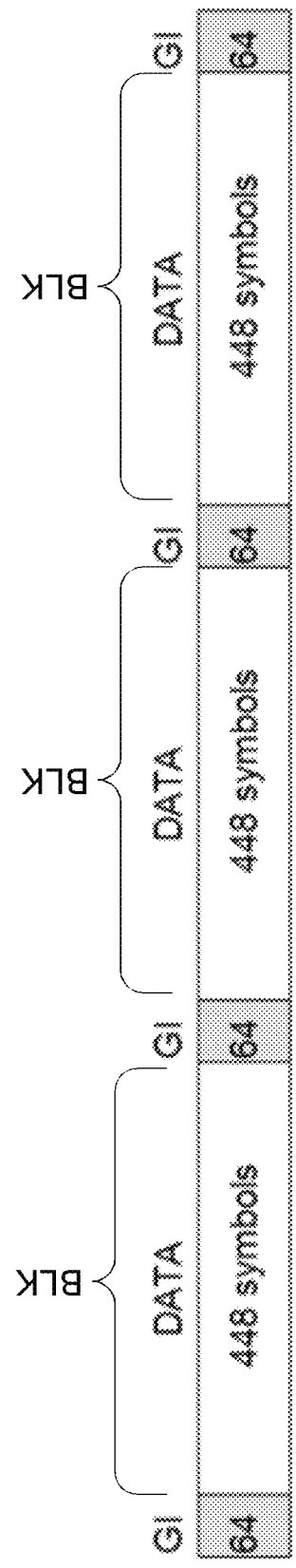
FIG. 4B is a diagram illustrating an example structure of data blocks of the single carrier frame format of 802.11ad.

FIG. 4B illustrates an example construction of SC data blocks (BLKs) according to the 802.11ad standard. In FIG. 4B, each BLK consists of 448 symbols. A 64 bit guard interval (GI) is used between every two adjacent BLKs to separate adjacent data blocks.

LDPC Codes with Codeword Length 672 in 802.11Ad

Embodiments of the high rate long LDPC code presented in this disclosure build on the LDPC codes specified in IEEE 802.11ad, and accordingly a brief description of the IEEE 802.11ad LDPC codes will now be provided to facilitate an understanding of embodiments described below in detail. As LDPC encoded codewords c are generated through operations of source words $\bar{u}$ and the generator matrix G, and as the generator matrix G is derived from LDPC parity check matrix H, LDPC parity check matrix H effects encoding source words $\bar{u}$ to codewords $\bar{c}$. The design of the LDPC parity check matrix H may improve the performance of the code. The parity-check matrix H may be further partitioned into square submatrices of size Z×Z. Z is a lifting factor. The submatrices are either cyclic-permutations of an Z×Z identity matrix $P_o$, or null submatrices with all zero entries.

FIGS. 5A-5D illustrate the parity check matrices H of four LDPC codes specified in 802.11ad with the rates of 1/2, 5/8, 3/4, and 13/16. In 802.11ad, each LDPC code has a common codeword length of 672 bits. The code rate K/N denotes that a K bit source word $\bar{u}$ is encoded to an N bit codeword $\bar{c}$. With respect to the 802.11ad standard, the codeword length N is 672 bits. Therefore, for the code rates of 1/2, 5/8, 3/4, and 13/16, the sizes K of the corresponding source word $\bar{c}$ are 336 bits, 420 bits, 504 bits, and 546 bits, respectively.

The index value i in each non-blank cell element in a matrix H denotes the cyclic-permutation sub-matrix $P_i$ obtained from the Z×Z identity matrix $P_o$ by cyclically shifting the columns of matrix $P_o$ to the right i columns. Blank entries indicate a Z×Z matrix of all zeros.

Figure 5E:
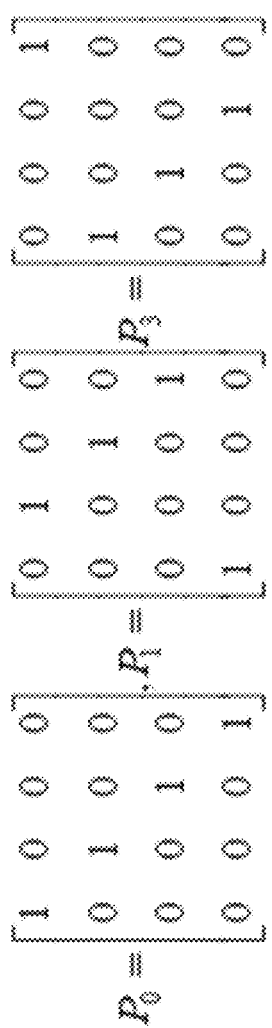
FIG. 5e illustrates cyclic-permutation submatrices obtained from a 4×4 identity matrix.

FIG. 5E illustrates an example of the cyclic permutation submatrices $P_1$ and $P_3$ obtained from an example Z×Z identity matrix $P_o$ for which Z=4. $P_1$ is obtained by shifting the columns of $P_o$ to the right by one element, and $P_3$ is obtained by shifting the columns of $P_o$ to the right by three elements. As seen in FIG. 5W, the identity matrix $P_o$ includes Z "1"s arranged diagonally across the matrix, with all other values being "0".

In FIG. 5A, matrix cell location having the index value i="0" represents submatrix $P_o$, which is a 42×42 identity submatrix, and the upper left cell location with the index value i="40" in FIG. 5A represents a submatrix obtained by shifting the columns of $P_o$ to the right by 40 elements. Similarly, any non-zero value i submatrices $P_i$ in FIGS. 5B-5D can also be obtained from the respective identity matrix $P_o$.

FIG. 5A shows a code rate 1/2 LDPC parity check matrix H=336 rows×672 columns, with Z=42. FIG. 5B shows a code rate 5/8 LDPC parity check matrix H=252 rows×672 columns, with Z=42. FIG. 5C shows a code rate 3/4 LDPC parity check matrix H=168 rows×672 columns, with Z=42. FIG. 5D shows a code rate 13/16 LDPC parity check matrix H=126 rows×672 columns, with Z=42. In FIGS. 5A-5D, the blank entries represent Z×Z submatrices with all zero entries.

Low Rate LDPC Codes with Long Codeword Length 1344 Proposals for 802.11ay

FIGS. 6A-6D illustrate four low rate LDPC codes proposed for 802.11ay in [REF 1] with the rates of 13/16, 3/4, 5/8 and 1/2. As noted above, the code rate K/N denotes that K bit source word $\bar{u}$ is encoded to an N bit codeword $\bar{c}$. With a codeword length N=1344 bits, the code rates of 13/16, 3/4, 5/8 and 1/2, have corresponding source word lengths of 1092, 1008, 840 and 672 bits, respectively.

Figure 6A:
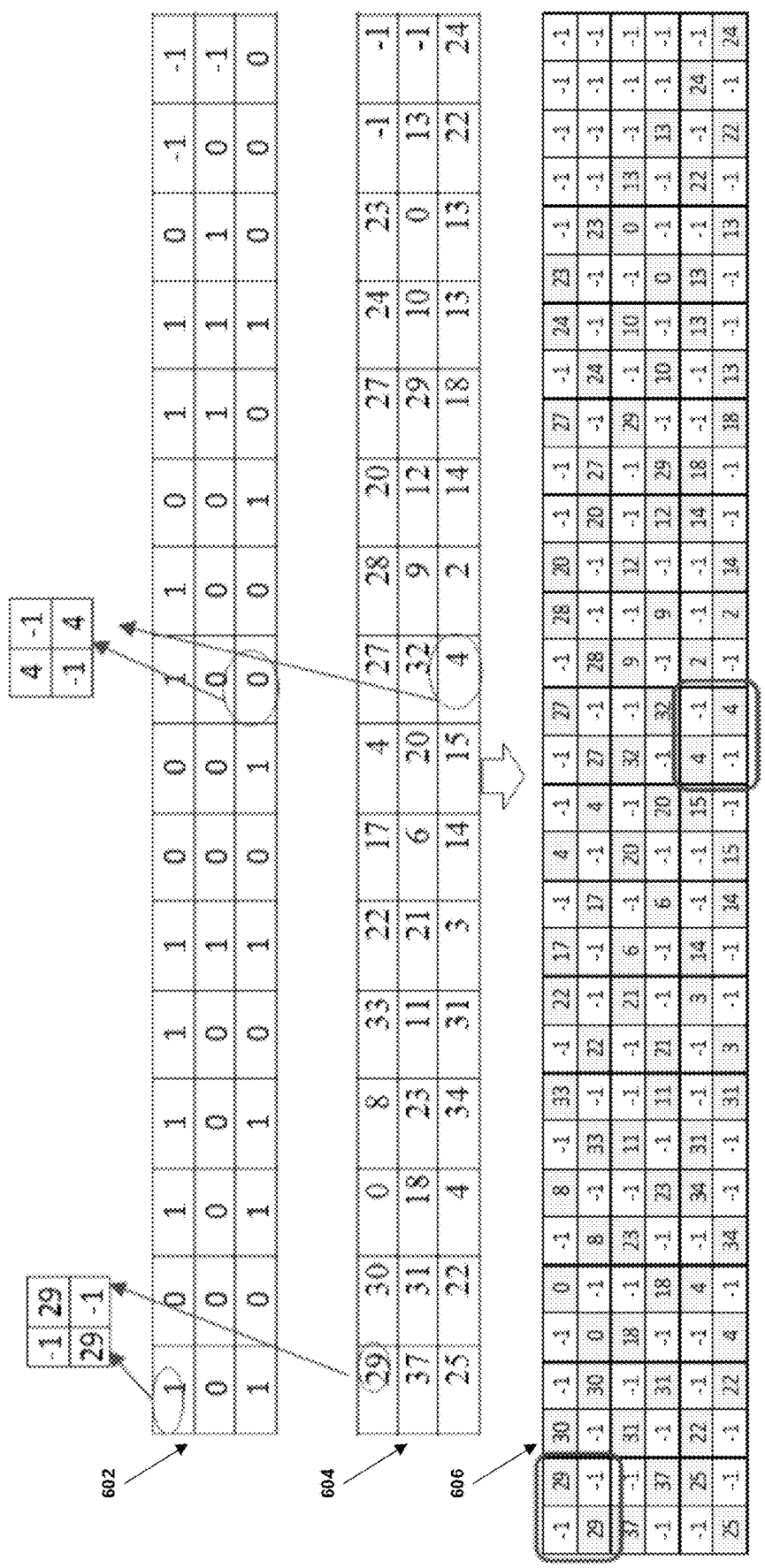
FIGS. 6A-6D are partitioned LPDC parity check matrices proposed in IEEE802.11ay with codeword length of 1344.

The long LDPC codes illustrated in FIGS. 6A-6D are generated through a two-step lifting process. In the example of FIG. 6A, the rate 13/16 (1344, 1092) LDPC code 606 with codeword length of 1344 is generated from applying a lifting matrix 602 to a base matrix 604. Base matrix 604 is the rate 13/16 length 672 partitioned LDPC matrix that is specified by IEEE 802.11ad. The rate 13/16 base matrix 604, with 3 rows and 16 columns of sub-matrices, corresponds to a lifting factor of Z=42 applied to an originating 126 row×672 column matrix of "1" and "0"s. Accordingly, a first lift by lifting factor Z=42 provides rate 13/16 base matrix 604, which is then lifted a second time through application of lifting matrix 602 to generate rate 13/16 LDPC code 606.

As shown in FIG. 6A, the lifting matrix 602 has the same number of rows and columns (3×16) as the rate 13/16 matrix 604 of 802.11ad. Each cell element in the lifting matrix 602 is assigned one of the three possible values "1", "0", and "−1". If a submatrix of the base matrix 604 is null (i.e. all zero entries), which is denoted as "4", the corresponding entry in the lifting matrix 604 is also denoted as "−1". For example, the entry at row 1, column 16 of the lifting matrix 604 corresponds to the submatrix at row 1, column 16 of the base matrix 602. Both the entry of the lifting matrix 604 and the submatrix of the base matrix 602 have the value of "−1".

To generate the 13/16 LDPC code 606 with codeword length of 1344, the lifting matrix 602 is applied to the 13/16 LDPC base matrix 604 with codeword length of 672. In particular, for a submatrix having a value "V" of the base matrix 604, if the entry of the corresponding lifting matrix 602 has a value of "1", applying the lift matrix 602 to the base matrix 604 generates 4 submatrices as follows:

| −1 | V |
|---|---|
| V | −1. |

For a submatrix having a value "V" of the base matrix 604, if the entry of the corresponding lifting matrix 602 has a value of "0", applying the lift matrix 602 to the base matrix 604 generates 4 submatrices of as follows:

| V | −1 |
|---|---|
| −1 | V. |

In FIG. 6A, in the example of the submatrix at row 1, column 1 of the base matrix 604, which has the value of "29", as the corresponding entry at row 1, column 1 of the lifting matrix 602 has a value of "1", applying the entry of the lifting matrix 602 with the corresponding submatrix of the base matrix 604 generates 4 submatrices as follows:

| −1 | 29 |
|---|---|
| 29 | −1. |

As well, in the example of the submatrix at row 3, column 9 of the base matrix 604, which has the value of "4", as the corresponding entry at row 3, column 9 of the lifting matrix 602 has a value of "0", applying the entry of the lifting matrix 602 with the corresponding submatrix of the base matrix 604 generates 4 submatrices as follows:

| 4 | −1 |
|---|---|
| −1 | 4 |

For the sub-matrices with the value of "−1" in the base matrix 604, the corresponding entries of the lifting matrix 602 also have the value of "−1". Applying the one entry with the value of "−1" in the lifting matrix 602 to the corresponding submatrix in the base matrix 604 generates four null submatrices.

Figure 6B:
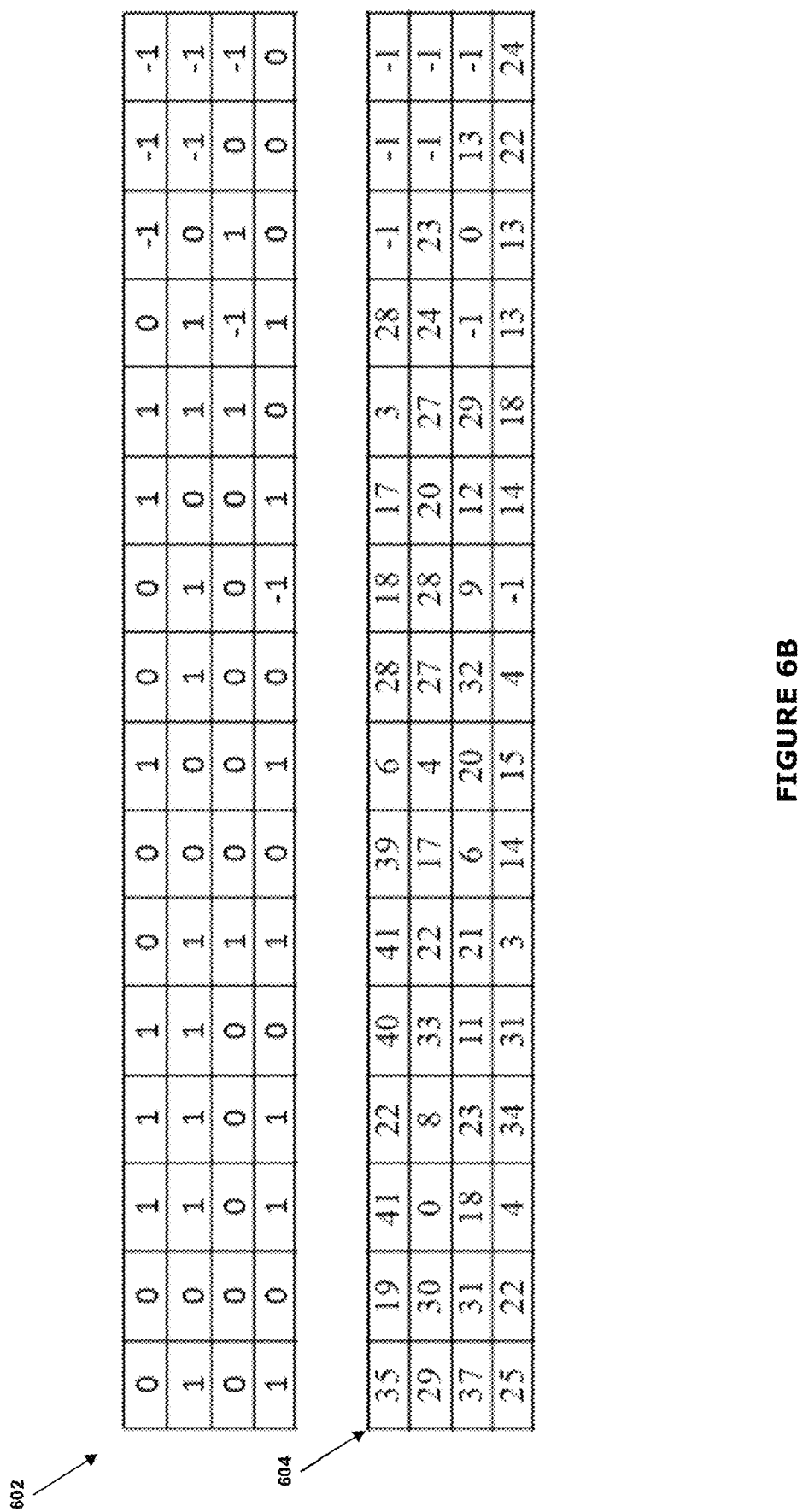
Figure 6C:
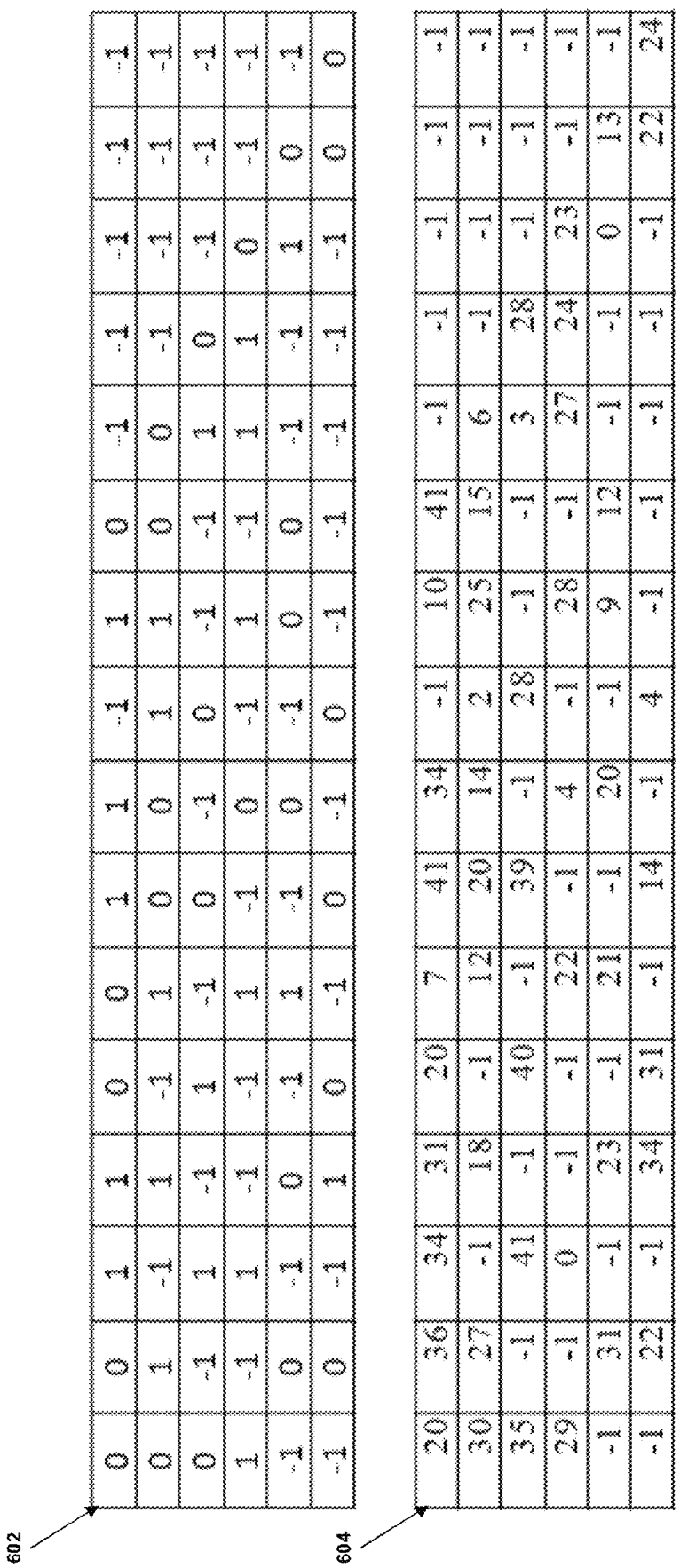
Figure 6D:
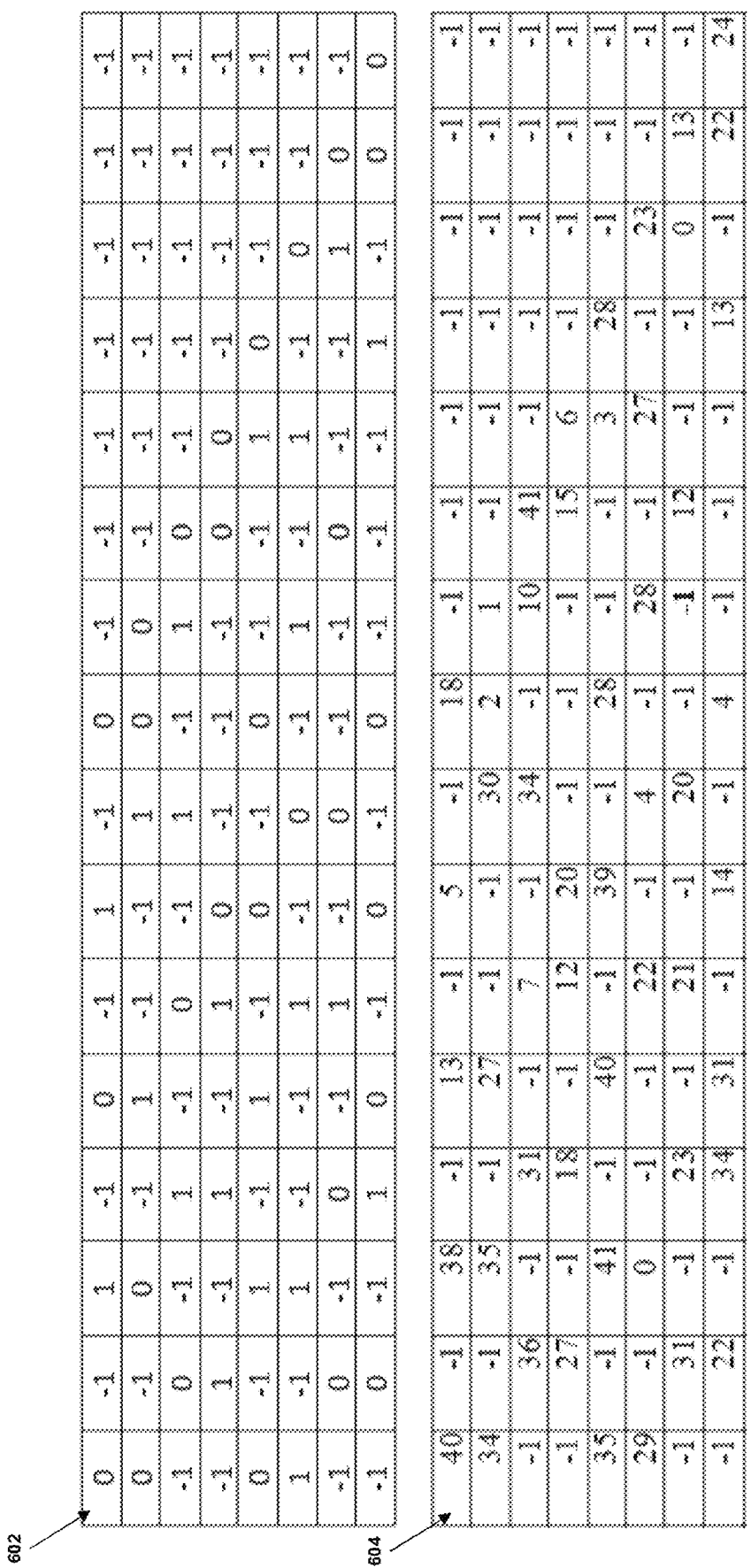

Similarly, the same rules described above to obtain the rate 13/16 LDPC code 606 with its codeword length of 1344, can be applied used with corresponding lifting matrices 602, as shown in FIGS. 6B-6D, to the codeword length 672, code rate 3/4, 5/8 and 1/2 base matrices 604 specified in IEEE 802.11ad, to generate corresponding rate 3/4, 5/8 and 1/2 LDPC codes each having a codeword length of 1344.

High Rate LDPC Code

The IEEE 802.11ad standard specifies an LDPC code with a high code rate of 7/8 (REF 2). Similarly, as noted above [REF 1] has proposed a rate 7/8 LDPC code with codeword length of 1248. The rate 7/8, length 1248 LDPC code [REF 1] is generated by puncturing the first 96 parity bits from the rate 13/16 (1344, 1092) LDPC code represented by the matrix 606 shown in FIG. 6A, which as indicated above is derived from the rate 13/16 length 672 base LDPC code specified in 802.11ad. In implementation, a transmitter does not transmit the punctured bits, and the receiver puts equal likelihood for 1/0 for the punctured bits. Accordingly, the proposed rate 7/8 LDPC code of FIG. 6A that is generated through puncturing results in a codeword length of 1248 rather than the codeword length of 1344 proposed for the long code, lower rate LDPC codes.

As noted above in respect of FIGS. 4A, 4B, prior to transmission LDPC codewords $\bar{c}$ are subjected to bit-to-symbol mapping, followed by blocking into blocks (BLKs) that have a defined number of symbols (for example 448 symbols or 896 symbols). Accordingly, the use of different codeword lengths for different code rates can lead to blocking inefficiencies in an environment where a data frame structure having a defined block length is intended to support different code rates. In particular, the blocking process that assembles the modulated codewords into data blocks may require additional processes to implement encoding and decoding for a rate 7/8 LDPC code that uses a different codeword length than other rates. In the case of the rate 7/8, length 1248 LDPC code obtained by puncturing a 13/16 rate code, the puncturing increases redundancy (padding zeros during encoding and SC blocking) and increases the complexity of SC blocking.

Figure 7A:
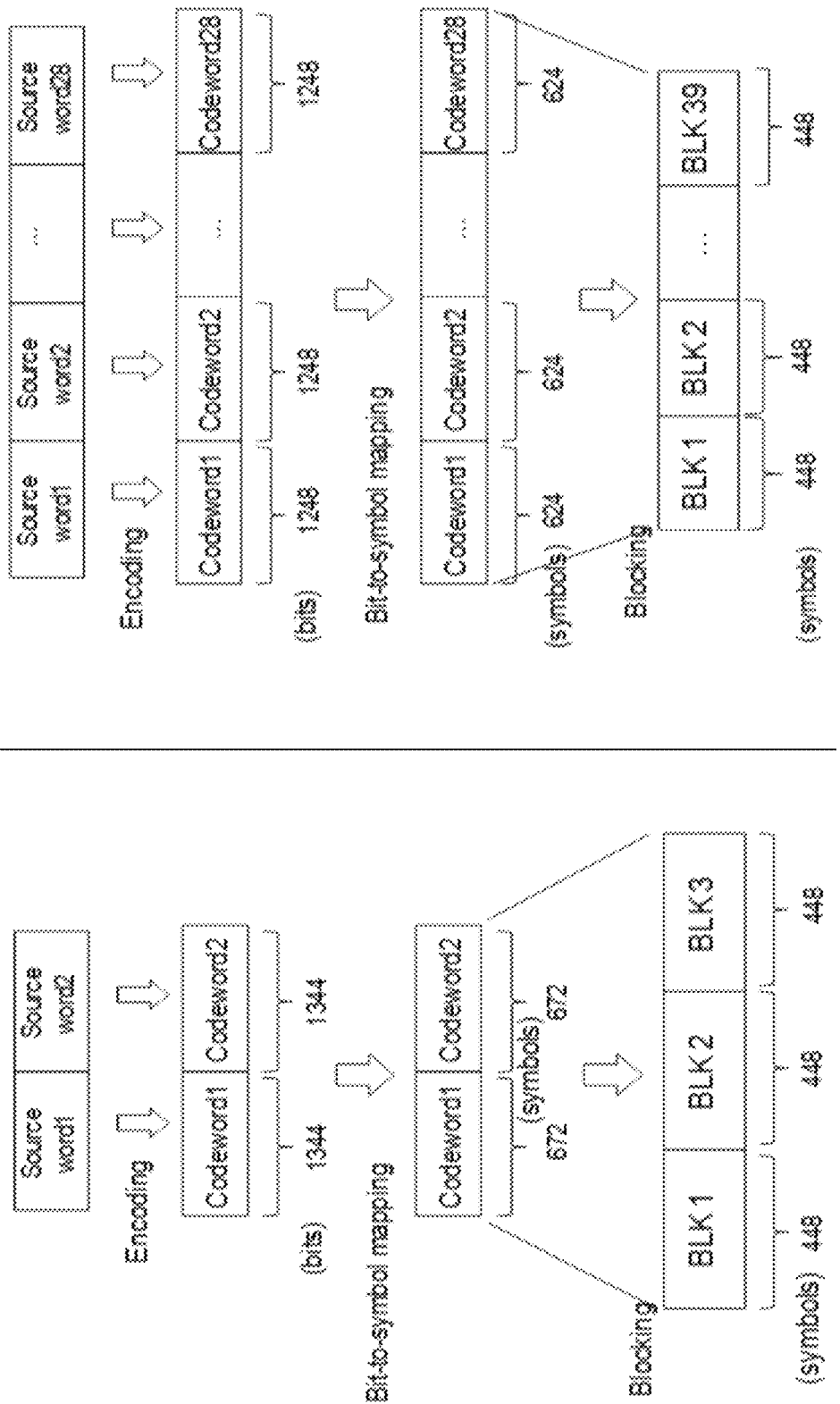
FIGS. 7A-7C are diagrams showing single carrier blockings with different modulation techniques.

For example, FIG. 7A shows, on the left, an example of SC QPSK blocking for a rate 7/8 DLPC code that uses a codeword length of 1344 (N=1344, K=1176), and on the right, an example of SC QPSK blocking for a rate 7/8 DLPC code that uses a punctured codeword length of 1248 (N=1248, K=1092). The example of FIG. 7A uses QPSK modulation for bit-to symbol mapping. With (N=1344, K=1176) QPSK, a 1344 bit codeword after modulation becomes a 672 symbol codeword. Every three SC data blocks (BLK1, BLK2, BLK3), which each contain 448 symbols, are constructed from 2 symbol codewords (each block is constructed from 1 or 2 codewords). By comparison, with (N=1248, K=1092) QPSK, a 1248 bit codeword after modulation becomes a 624 symbol codeword. As a result, the blocking process becomes more complex: every 39 data blocks are constructed from 28 codewords, and each data block is constructed from one or two codewords.

Figure 7B:
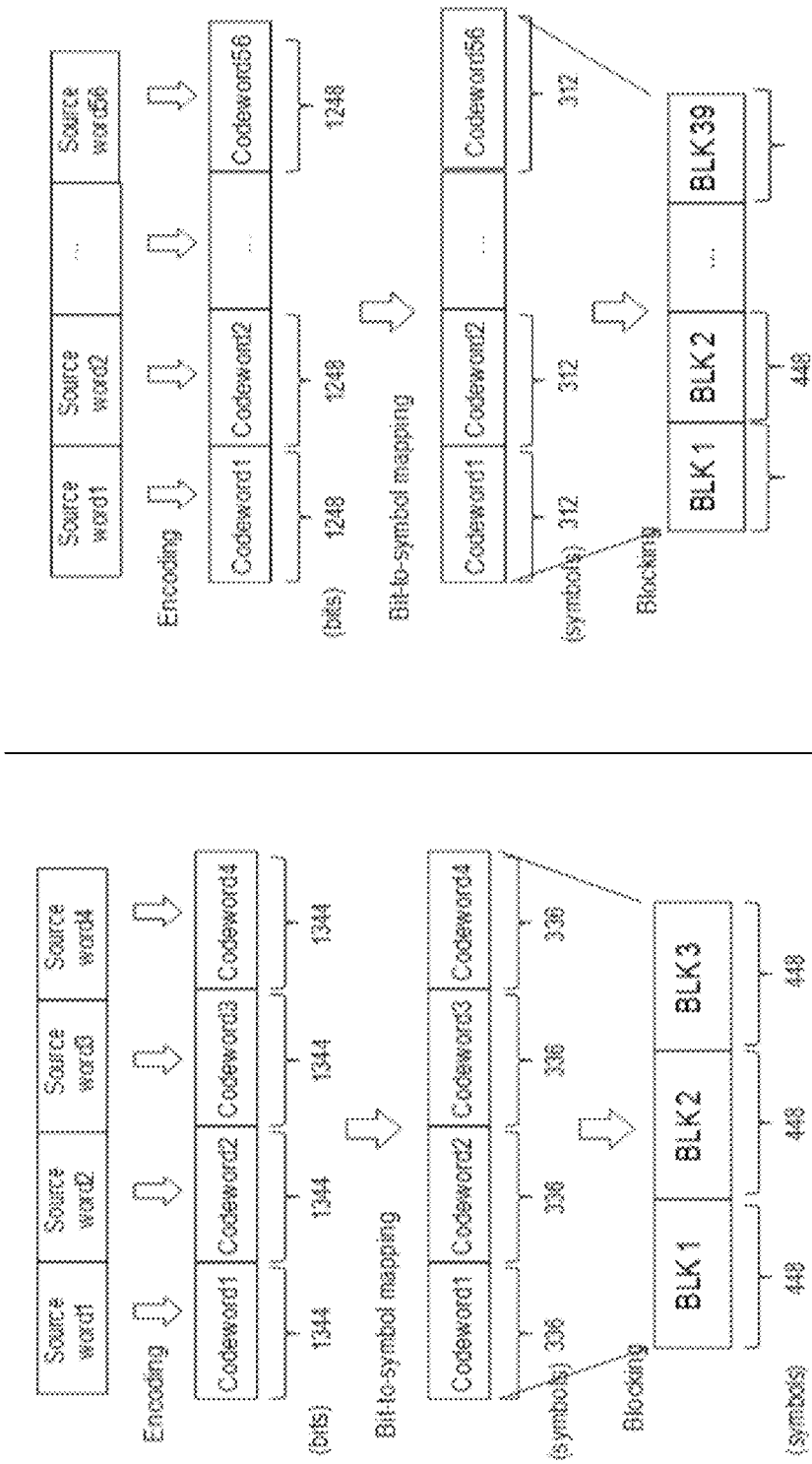

FIG. 7B shows examples of SC 16QAM blocking with (1344, 1176) LDPC (left side) as compared to (1248, 1092) LDPC (right side). With (1344, 1176) LDPC, with 16QAM, one 1344 bit codeword after modulation becomes one 336 symbol codeword. Every three SC data blocks are constructed from four 336 symbol codewords, with each 448 symbols data block constructed from two symbol codewords. However, with (1248, 1092) LDPC, each of the encoded codewords contains 1248 bits, which becomes a 312 symbol codeword after 16 QAM modulation. As a result, the blocking process becomes more complex: every 39 data blocks are constructed from 56 codewords.

Figure 7C:
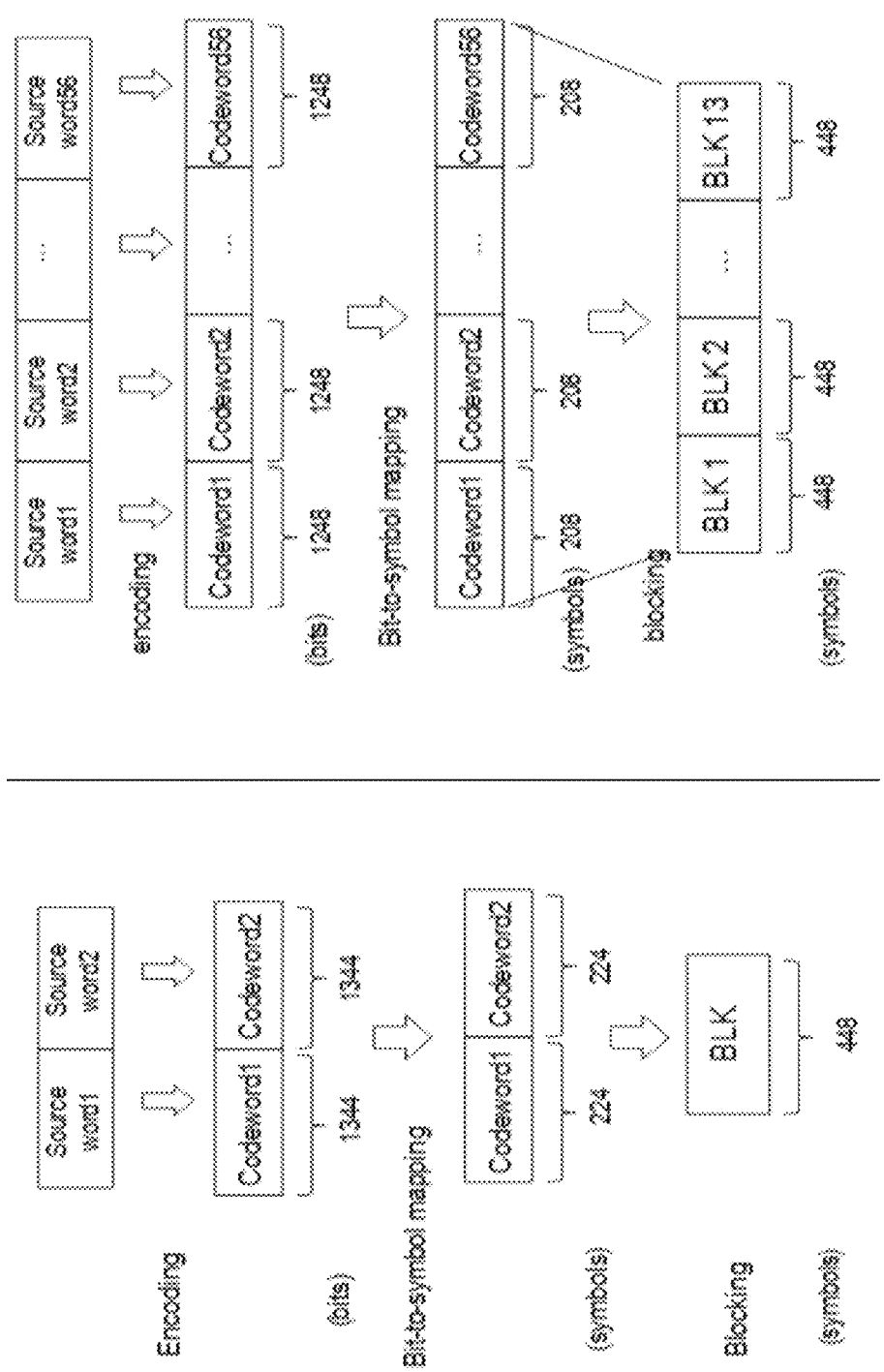

Similarly, FIG. 7C shows examples of SC 64QAM blocking with (1344, 1176) LDPC (left side) as compared to (1248, 1092) LDPC (right side). With (1344, 1176) LDPC, with 64QAM, one 1344 bit codeword after modulation becomes one 224 symbol codeword. Each 448 symbols data block is constructed from two 224 symbol codewords. However, with (1248, 1092) LDPC, one 1248 bit codeword after modulation becomes one 208 symbol codeword. As a result, the blocking process becomes more complex: every 13 data blocks are constructed from 28 codewords, and each data block is constructed from 3 or 4 codewords.

Figure 9:
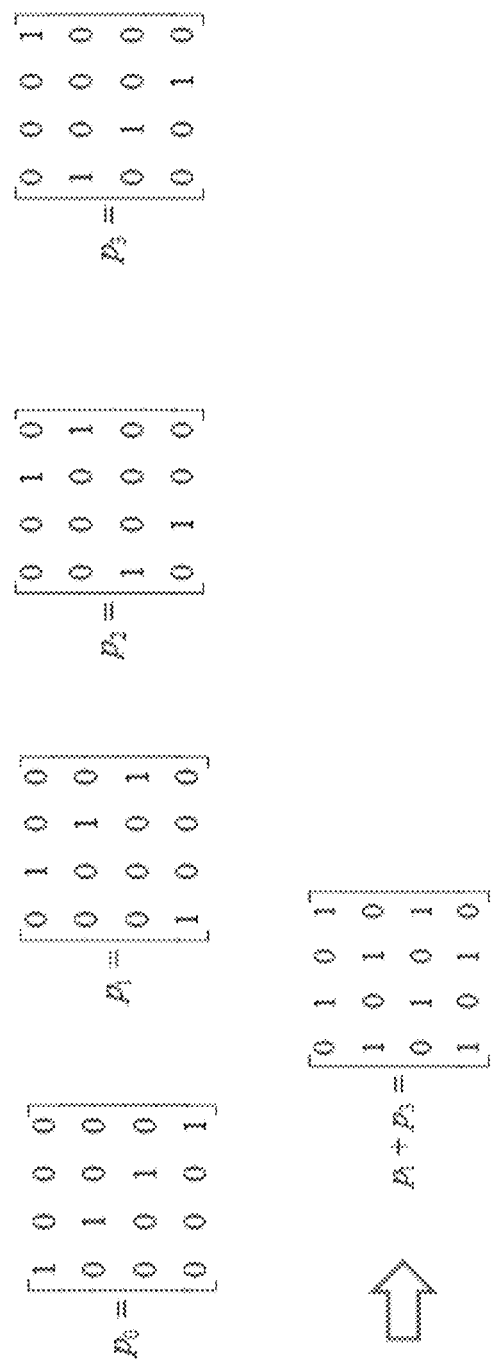
FIG. 9 is a diagram illustrating an example of summing cyclic-permutation matrices for the simplified case of Z=4.

[REF 2] proposes a high rate 7/8 LPDC code for a short codeword length of N=672). Referring to FIG. 8, the rate 7/8 length 672 LPDC matrix Hn 860 in [REF 2] is derived by summing rows from the 802.11ad specified rate 3/4 length 672 (672, 504) LDPC matrix H 850. As noted above 802.11ad rate 3/4 length 672 LPDC matrix 850 is obtained by using lift factor Z=42 to partition an original binary matrix of 168 rows (N−K=168) by 672 columns (N=672), providing 3/4 length 672 LPDC base matrix H 850 that can be represented as 4 rows (R=(N−K/42)) and 16 columns (C=N/42), with each submatrix Pi represented in an array element by an index value i that represents cyclic shift applied to an identity matrix (or a "blank" or "-" to indicate a "null" all zero submatrix). Selected rows from the base 3/4 length 672 LPDC matrix H 850 are summed together to provide 3/4 length 672 LPDC matrix Hn 850. In particular, the sub-matrices from the first row R1 and third row R3 of base code matrix H 850 are summed to provide sub-matrices for corresponding column entries in the first row of new LDPC matrix Hn 850, and the sub-matrices from the second row R2 and the fourth row R4 of base code matrix H 850 are summed using modulo-2 addition to provide sub-matrices for corresponding column entries in the second row of new LDPC matrix Hn 850. For explanatory purposes, FIG. 9 illustrates the addition of cyclic-permutation matrices for the simplified case where Z=4, using modulo-2 addition.

High Rate 7/8 Long LDPC Code with Length N=1344

Example embodiments will now be described that are particularly directed to a high rate, long LDPC code that provides a code-word length that is consistent with that specified for lower rate codes, namely N=1344.

Figure 10:
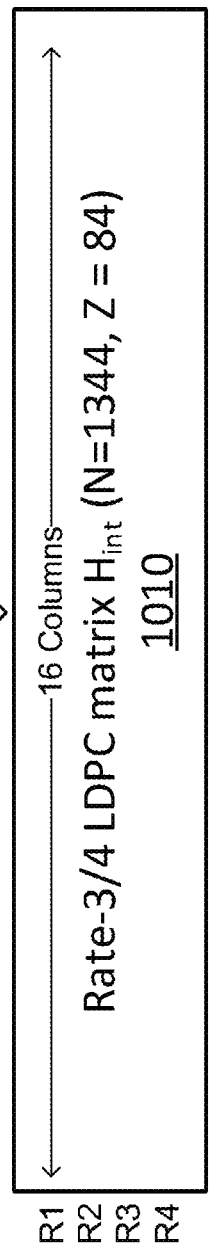
FIG. 10 illustrates a method for generating a length 1344 LDPC matrix $H_f$ of code rate 7/8 based on rate 3/4 LDPC in 802.11 according to the present disclosure.
Figure 10:

FIG. 10 represents a method for generating a rate 7/8 LDPC matrix $H_I$ 1020 with a codeword length N=1344 according to one example embodiment. In the example of FIG. 10, the 802.11ad specified rate 3/4 length 672 (672, 504) LDPC matrix H 850 is used as a base matrix, however, the lifting factor is increased from Z=42 to Z=84 to produce a rate 3/4 length 1344 LDPC matrix $H_{int}$ 1010 as an intermediate matrix. In particular, to construct 3/4 rate LDPC matrix $H_{int}$ 1010 with codeword size 672×2=1344, the structure of the base matrix 850 and the column position shifts remain the same, but the lifting factor is increased from Z=42 to Z=84. For example, the binary 3/4 base matrix 850 with the codeword length of 672 of 802.11ad contains 168 rows×672 columns, Z=42. As shown in FIG. 10, the partitioned 3/4 base matrix 840 contains 4 rows×16 columns of submatrices, and each submatrix has a size of Z×Z (42×42). When the lifting factor Z increases from 42 to 84, the intermediate, partitioned 3/4 length 1344 LDPC matrix $H_{int}$ 1010 includes 4 rows×16 columns of submatrices, representing a binary matrix of 336 rows×1344 columns.

In an example embodiment, selected rows of the intermediate rate 3/4 length 1344 LDPC matrix $H_{int}$ are summed to generate rate 7/8 LDPC matrix $H_I$ 1020 with a codeword length N=1344. In particular, the sub-matrices from the first row R1 and third row R3 of intermediate LPDC matrix $H_{int}$ 1010 are summed using modulo-2 addition to provide sub-matrices for corresponding column entries in the first row of new LDPC matrix $H_I$ 1020, and the sub-matrices from the second row R2 and the fourth row R4 of intermediate LPDC matrix $H_{int}$ 1010 are summed using modulo-2 addition to provide sub-matrices for corresponding column entries in the second row of new LDPC matrix $H_I$ 1020.

Figure 11:
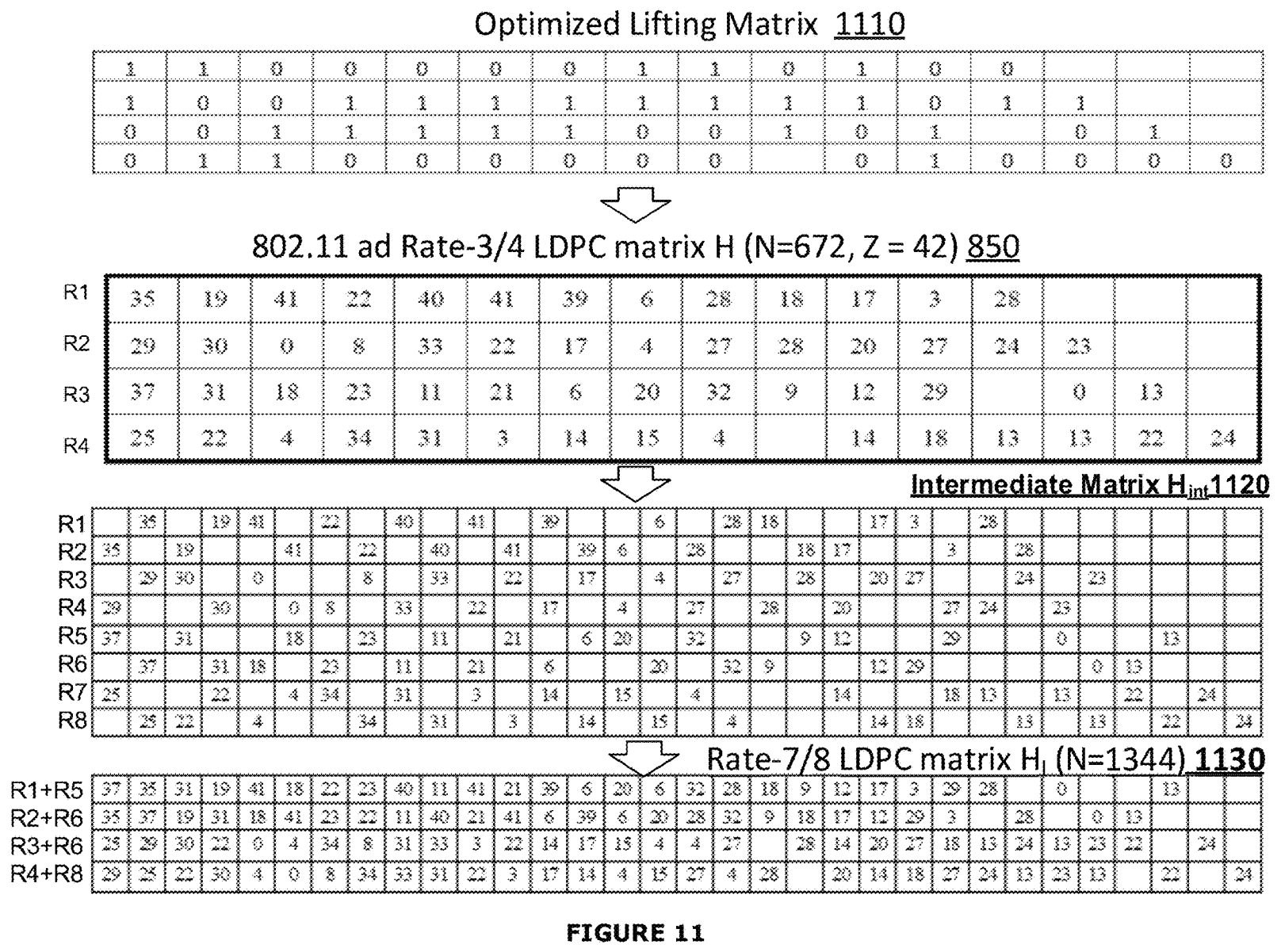

FIG. 11 represents a further example embodiment of a method for generating a rate 7/8 LDPC matrix $H_I$ 1130 with a codeword length N=1344 according to one example embodiment. In the example of FIG. 11, the 802.11ad specified rate 3/4 length 672 (672, 504) LDPC matrix H 850 is once again used as a base matrix, however, instead of using an extended lifting factor as discussed in the immediately preceding example, a lifting matrix 1110 is used to generate an intermediate matrix $H_{int}$ 1120. The lifting matrix 1110 is selected through an optimization search using criteria to yield an optimized error rate performance. In the illustrated embodiment lifting matrix 1110 is selected such that it first and third rows are complementary and its second and fourth rows are complementary.

The lifting matrix 1110 is applied to 802.11ad specified rate 3/4 length 672 (672, 504) LDPC matrix H 850 to generate intermediate matrix $H_{int}$ 1120 in the same manner as described above in respect of FIGS. 6A-6D. The resulting intermediate matrix $H_{int}$ 1120 includes 8 rows of 32 columns of submatrix elements, with each submatrix element being denoted by an index value i indicating the cyclic shift applied to a Z×Z (Z=42) identity matrix $P_o$, or a null value to indicate an all "0" submatrix. Thus, the partitioned intermediate matrix $H_{int}$ 1120 represents a 336 row by 1344 column binary matrix.

As shown in FIG. 11, periodic rows of the intermediate matrix $H_{int}$ 1120 are summed to generate rate 7/8 LDPC matrix $H_I$ 1130 with a codeword length N=1344. In particular, the sub-matrices from the first row R1 and fifth row R5 of intermediate matrix $H_{int}$ 1120 are summed using modulo-2 addition to provide sub-matrices for corresponding column entries in the first row of new LDPC matrix $H_I$ 1130. Similarly the second and six rows of intermediate matrix $H_{int}$ 1120 are summed to the second row of new LDPC matrix $H_I$ 1130; the third and seventh rows of intermediate matrix $H_{int}$ 1120 are summed to provide the third row of new LDPC matrix $H_I$ 1130; and the fourth and eighth rows of intermediate matrix $H_{int}$ 1120 are summed to provide the fourth row of new LDPC matrix Hn 1130. As shown in FIG. 11, the partitioned LDPC matrix $H_I$ 1130 includes 4 rows of 32 columns of submatrix elements, each submatrix element representing a Z×Z submatrix with Z=42, such that binary matrix $H_I$ has a size of 168 rows by 1344 columns.

It will be appreciated that the example of FIG. 11 relies on a combination of a lifting step and a summation step to generate matrix $H_I$ 1130.

Figure 12:
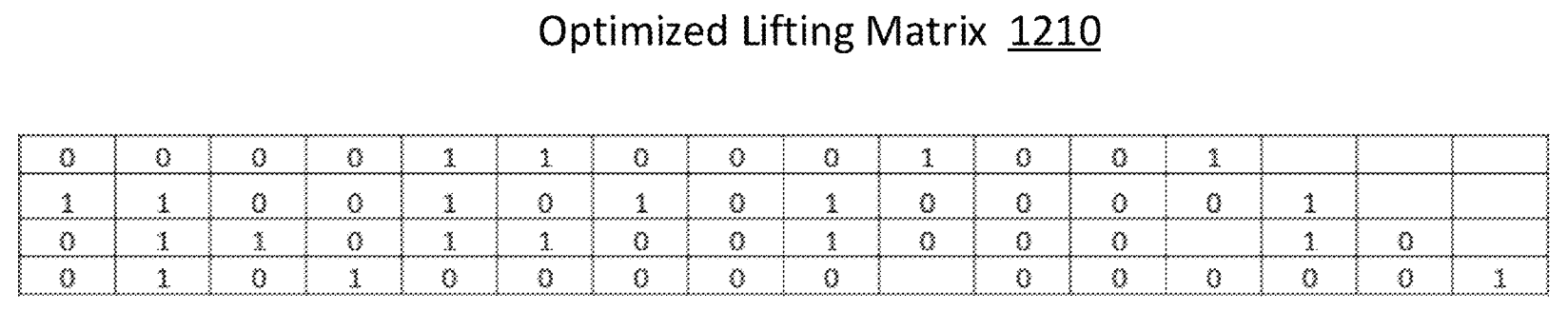

In at least some examples, a different optimized lifting matrix can be used in place of the lifting matrix 1110 shown in FIG. 11, and in this regard FIG. 12 shows an example of a further optimized lifting matrix 1210 that may be used in some examples in place of lifting matrix 1110.

Figure 13:
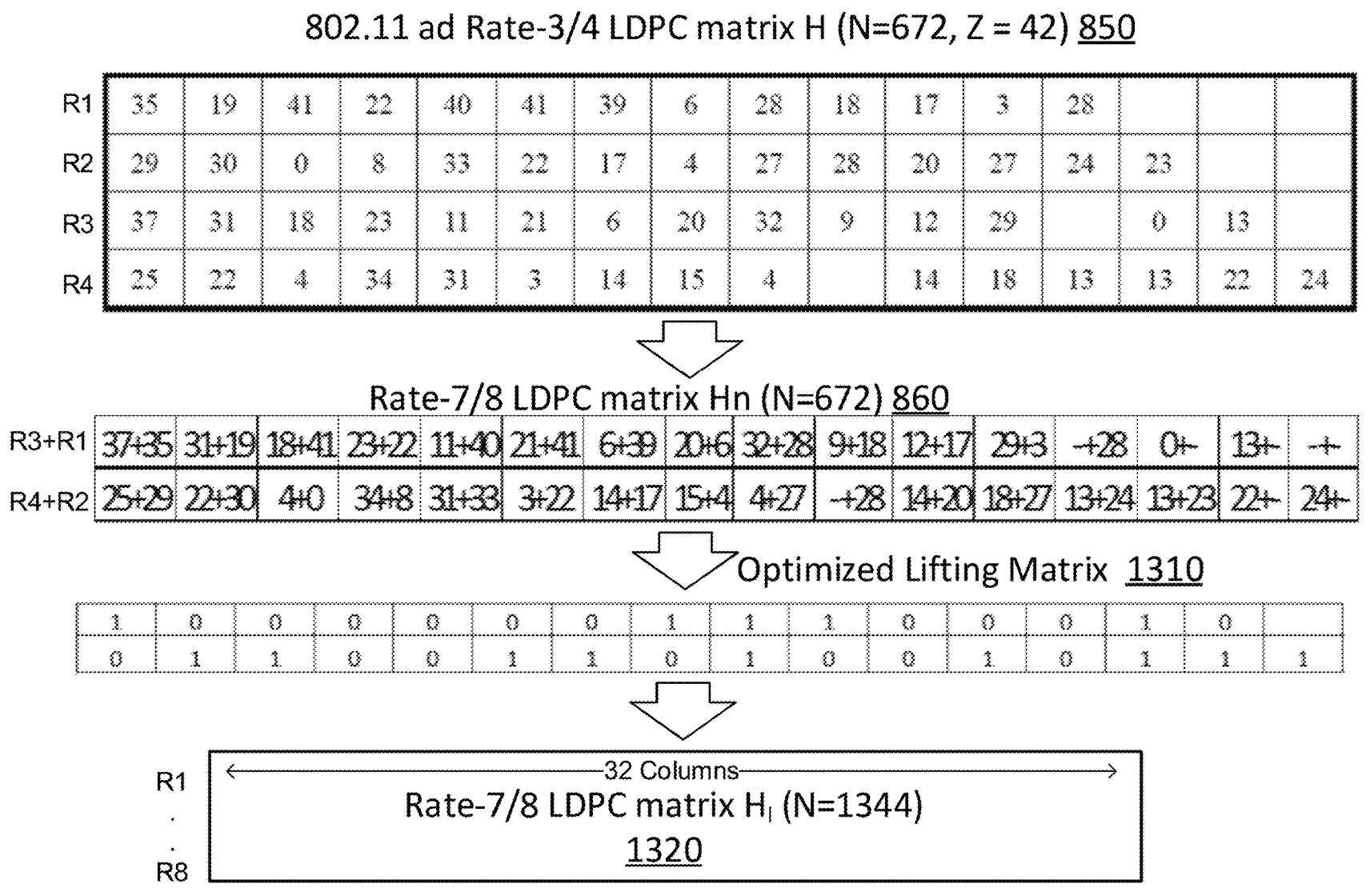

FIG. 13 represents a further example embodiment of a method for generating a rate 7/8 LDPC matrix $H_I$ 1330 with a codeword length N=1344 according to another example embodiment. In the example of FIG. 13, the 802.11ad specified rate 3/4 length 672 (672, 504) LDPC matrix H 850 is once again used as a base matrix, and in particular is used to generate rate 7/8 length 672 LPDC matrix Hn 860 as an intermediate matrix in the same manner as described above in respect of FIG. 8. A 2 row by 16 column optimized lifting matrix 1310 is the applied, using the same lifting matrix techniques described above, to the rate 7/8 length 672 LPDC matrix Hn 860 to obtain rate 7/8 length 1344 LDPC matrix $H_I$ 1330. As shown in FIG. 13, the partitioned LDPC matrix $H_I$ 1320 includes 8 rows of 32 columns of submatrix elements, each submatrix element representing a Z×Z submatrix with Z=42, such that binary matrix $H_I$ 1320 has a size of 336 rows by 1344 columns.

In an example embodiment, the optimized lifting matrix is selected by performing an optimization search for the lifting matrix that provides optimized error rate performance. In the case of optimized lifting matrix 1310, in some examples embodiments a random interleaver is included between encoding at LDPC encoder and modulating at Bit-to-Symbol modulator 206.

In at least some examples, a different optimized lifting matrix can be used in place of the lifting matrix 1310 shown in FIG. 13, and in this regard FIG. 14 shows an example of a further optimized lifting matrix 1410 that may be used in some examples in place of lifting matrix 1310. In the case of optimized lifting matrix 1410, in some examples embodiments a regular row-column interleaver is included between encoding at LDPC encoder and modulating at Bit-to-Symbol modulator 206.

In at least some configurations, the embodiments of 7/8 length 1344 LDPC matrix $H_I$ provide an LDPC structure that can provide one or more of the following features: be backward compatible with 11ad; co-exist with 11ad; provide a rate 7/8 LDPC code which keeps the codeword length of 1344 unchanged from other LPDC codes of different code rates proposed IEEE 802.11ay; reduce the redundancy (padding zeros) in encoding and single carrier blocking; optimize a new rate 7/8 LDPC code to have comparable or better performance than a punctured solution.

Decoder & Decoding Method

Figure 15A:
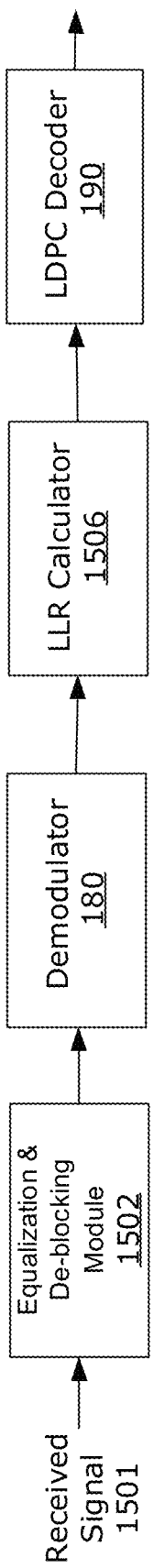
FIG. 15A is a block diagram representing an example implementation of a receiver of the present disclosure.
Figure 15B:
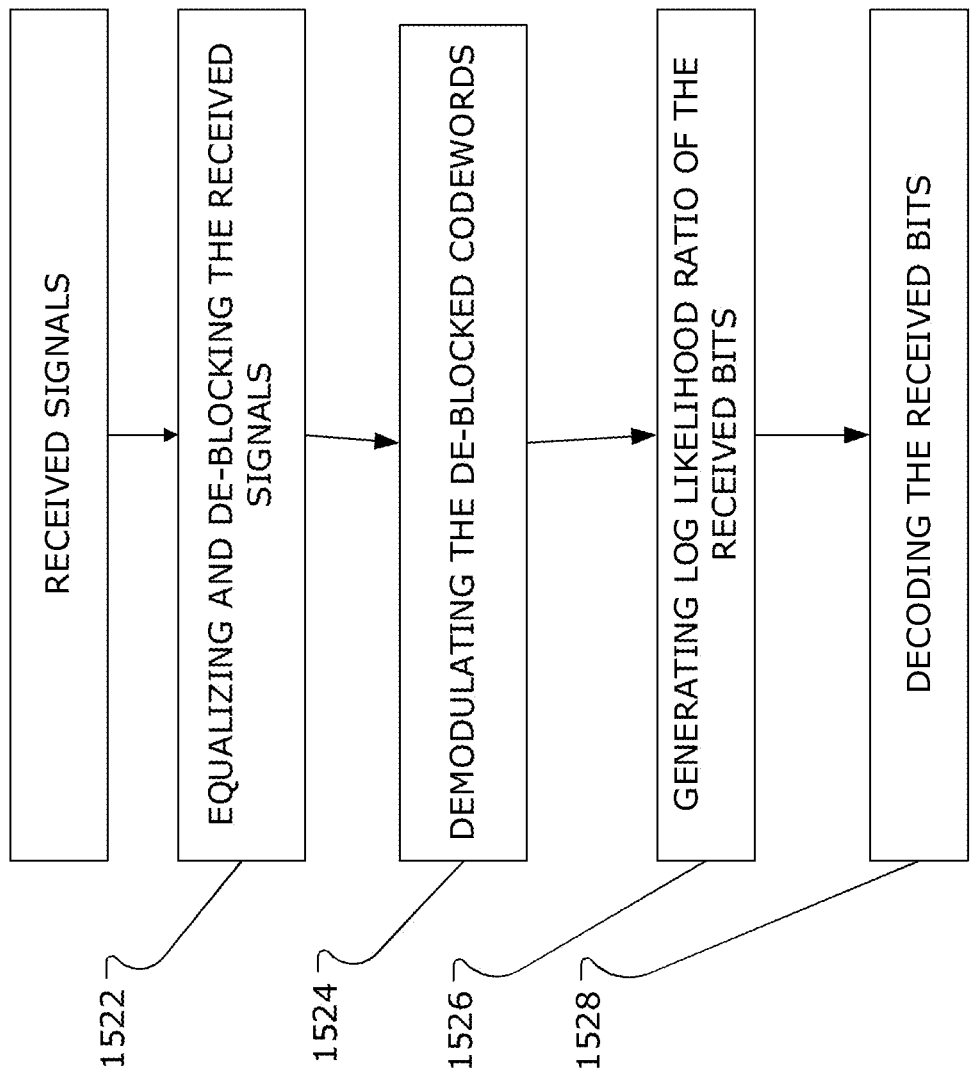
FIG. 15B is a block diagram representing an example steps in a process of decoding a received signal according to one embodiment of the present disclosure.
Figure 16:
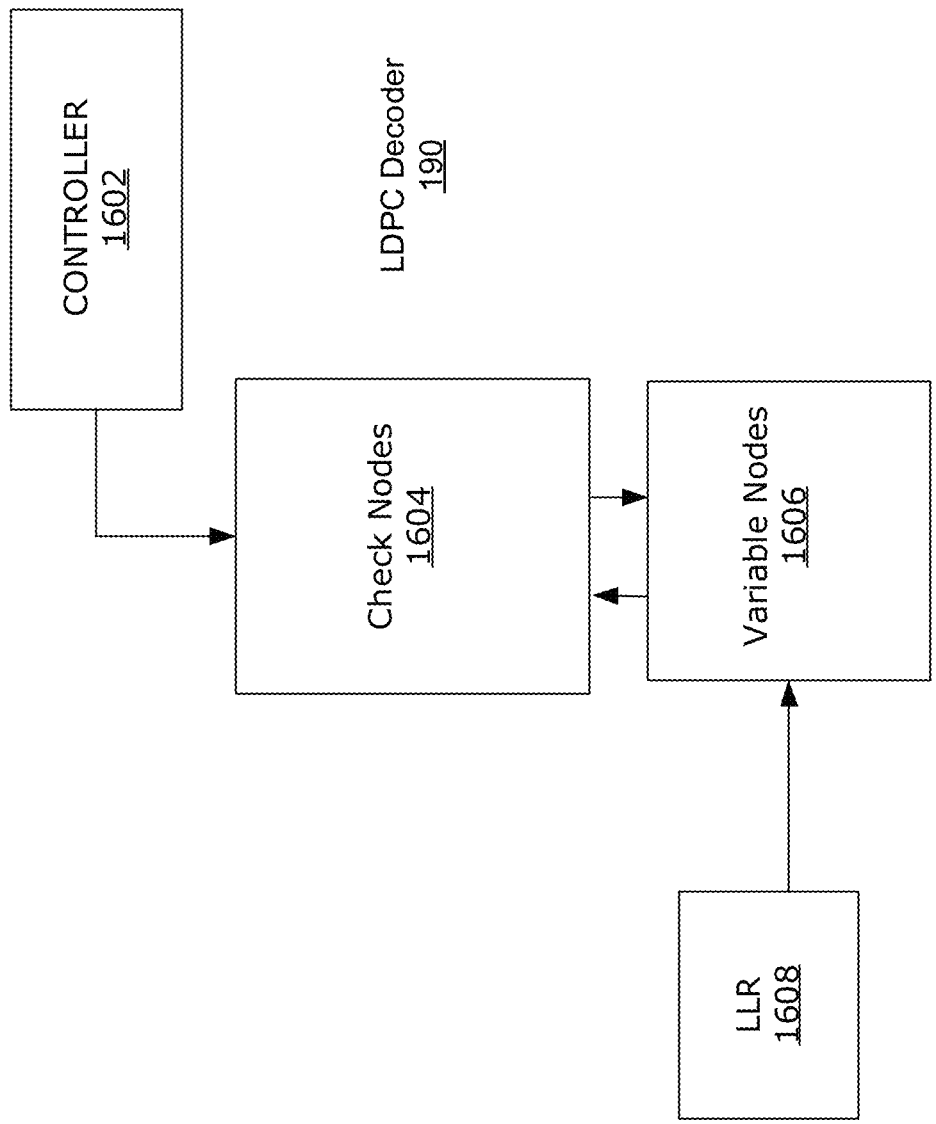
FIG. 16 is a block diagram representing an example implementation of an LDCP decoder of the present disclosure.

An LDPC encoded signal may be received at a receiver of the STA 102 or AP 104. As illustrated in the example of FIG. 15A, the receiver includes an equalization and de-blocking module 1502, a demodulator 180, an LLR calculator 1506, and an LDPC decoder 190. Optionally, the LLR calculator 1506 can be a component of the demodulator 180. As shown in FIG. 15B, with the received LDPC encoded signal, the equalization and de-blocking module 1502 first equalizes the received signal 1501 to reduce intersymbol interference caused by the channel through which the received signal is transmitted, and then de-blocks the equalized signal to recover the codewords symbols (step 1522). The demodulator 180 demodulates the de-blocked codewords symbols to codewords in bits (step 1524), for example, by BPSK, QPSK, 16QAM, or 64QAM. An LLR calculator 180 may be used to generate a log likelihood ratio of the bits value of de-blocked codeword symbols (step 1526). The log likelihood ratio may be used as the input of the LDPC decoder 190. The LDPC decoder 190 may then use the LDPC matrix $H_n$ that is used in encoding the source words to decode the demodulated signal, the signal having a 1×N row vector S (step 1528). The LDPC decoder 190 generates a 1×N row vector $\bar{c}=[c_1, \ldots, c_n]$ to recover a 1×K source word row vector $\bar{u}$. To be a valid codeword $\bar{c}=[c_1, \ldots, c_n]$, the $H\bar{c}^T=0$. Various algorithms are available to decode the LDPC encoded signal, for example, message passing algorithm. FIG. 16 is an example LDPC decoder using message passing algorithm to decode the LDPC encoded source words. Other decoding algorithm may also be used to implement the LDPC decoding. In the case of message passing algorithm is used, the LDPC decoder 190 may include a controller 1602, a check nodes module 1604 and a variable node module 1606.

As described above, the LDPC encoding information of the transmitted signal may be included in the frame transmitted, such as the information of the K/N rate LPDC code $H_n=(N-K)\times N$ LDPC matrix used to encode the source words. In one embodiment of the present application, a K/N rate LPDC code $H_n=(N-K)\times N$ may be used, at the LDPC decoder 190, with a lifting factor of Z. As described in the encoding process, $H_n$ comprises a plurality of submatrices, and each submatrix has a size of $Z\times Z$. The methods of generating the parity check matrix have been described in the encoding process.

Figure 17:
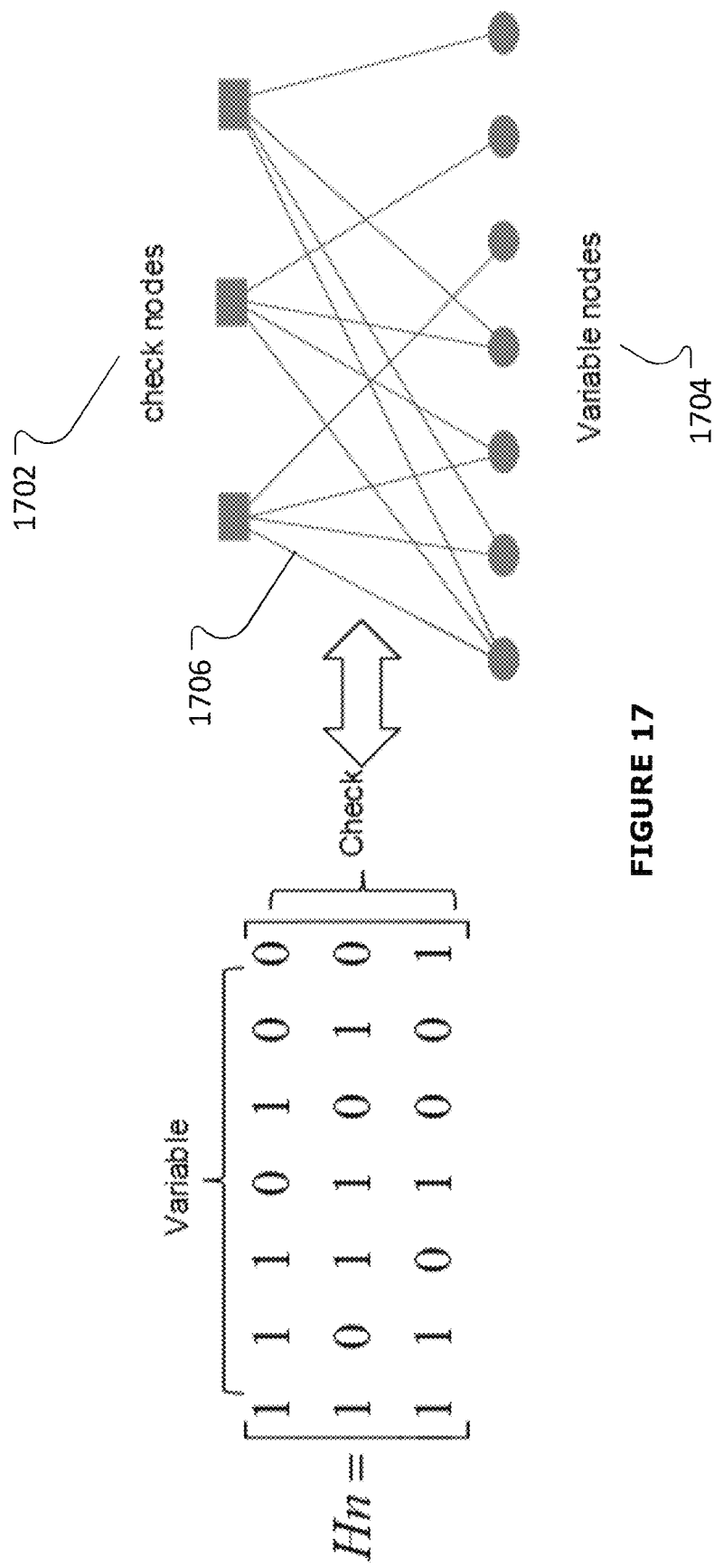
FIG. 17 is a diagram illustrating an example LDPC decoding process.

The codewords in bits may be decoded with the matrix $H_f$, for example, using the message passing algorithm (MPA) with the LLR values. As illustrated in the example of FIG. 17, the LDPC decoding with MPA is an iterative decoding algorithm that uses the structure of the Tanner graph, which is the graphical representation of the LPDC parity check matrix $H_f$. In the LDPC decoder 190, each check node 1702 determines the value of an erased bit based on the LLR value if it is the only erased bit in its parity-check equation. The messages passed along the Tanner graph edges 1706. For each iteration of the algorithm, each variable node 1704 sends a message ("extrinsic information") to each check node 1702 to which the variable node 1704 is connected. Each check node 1702 sends a message ("extrinsic information") to variable nodes 1704 to which the check node 1702 is connected. "Extrinsic" in this context means that the information the check nodes 1702 or variable nodes 1704 already possess is not passed to that node. A posteriori probability for each codeword bit is calculated based on the received signal at the LLR calculator 1506 and the parity constraints defined in the $H_f$, namely, to be a valid codeword $\bar{c}=[c_1, \ldots, c_n]$, the $H\bar{c}^T=0$.

In a layered architecture of the LDPC decoder 190, Z parallel check node processors process sequentially the messages of the edges relative to a submatrix of Z rows of the parity-check matrix. In an example, Z=42 and the edges are 16. The cyclic shift structure simplifies the decoder architecture that allows to feed the parallel processors with a simple barrel shifter. When the processing of a layer is terminated, the parity-check processors are re-initialized and the next layer is processed.

The present disclosure provides certain example algorithms and calculations for implementing examples of the disclosed methods and systems. However, the present disclosure is not bound by any particular algorithm or calculation. Although the present disclosure describes methods and processes with steps in a certain order, one or more steps of the methods and processes may be omitted or altered as appropriate. One or more steps may take place in an order other than that in which they are described, as appropriate.

Through the descriptions of the preceding embodiments, the present invention may be implemented by using hardware only, or by using software and a necessary universal hardware platform, or by a combination of hardware and software. Based on such understandings, the technical solution of the present invention may be embodied in the form of a software product. The software product may be stored in a non-volatile or non-transitory storage medium, which can be a compact disk read-only memory (CD-ROM), USB flash drive, or a hard disk. The software product includes a number of instructions that enable a computer device (personal computer, server, or network device) to execute the methods provided in the embodiments of the present invention.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method for encoding a source word, comprising:
 receiving a 1×K source word row vector $\bar{u}$; and
 generating a 1×N codeword vector $\bar{c}=\bar{u}\cdot G$, wherein
  G is a K×N generator matrix derived from a parity check matrix $H_f$; and
 wherein $H_f$ is derived from a base parity check matrix H by applying an optimized lifting matrix to the base parity check matrix H, the optimized lifting matrix being either:

| 1 | 1 | 0 | 0 | 0 | 0 | 0 | 1 | 1 | 0 | 1 | 0 | 0 |   |
|---|---|---|---|---|---|---|---|---|---|---|---|---|---|
| 1 | 0 | 0 | 1 | 1 | 1 | 1 | 1 | 1 | 1 | 1 | 0 | 1 | 1 |
| 0 | 0 | 1 | 1 | 1 | 1 | 1 | 0 | 0 | 1 | 0 | 1 |   | 0 | 1 |
| 0 | 1 | 1 | 0 | 0 | 0 | 0 | 0 | 0 |   | 0 | 1 | 0 | 0 | 0 0 | or

| 0 | 0 | 0 | 0 | 1 | 1 | 0 | 0 | 0 | 1 | 0 | 0 | 1 |   |
|---|---|---|---|---|---|---|---|---|---|---|---|---|---|
| 1 | 1 | 0 | 0 | 1 | 0 | 1 | 0 | 1 | 0 | 0 | 0 | 0 | 1 |
| 0 | 1 | 1 | 0 | 1 | 1 | 0 | 0 | 1 | 0 | 0 | 0 |   | 1 | 0 |
| 0 | 1 | 0 | 1 | 0 | 0 | 0 | 0 | 0 |   | 0 | 0 | 0 | 0 | 0 1. |

2. The method of claim 1 wherein different rows in the base parity check matrix are summed to obtain $H_f$.

3. The method of claim 2 wherein rows 1 and 3 of the intermediate base parity check matrix are summed.

4. The method of claim 2 wherein rows 2 and 4 of the intermediate base parity check matrix are summed.

5. The method of claim 1 wherein $H_f$ is:

| 37 | 35 | 31 | 19 | 41 | 18 | 22 | 23 | 40 | 11 | 41 | 21 | 39 | 6  | 20 | 6  | 32 | 28 | 18 |
| 35 | 37 | 19 | 31 | 18 | 41 | 23 | 22 | 11 | 40 | 21 | 41 | 6  | 39 | 6  | 20 | 28 | 32 | 9  |
| 25 | 29 | 30 | 22 | 0  | 4  | 34 | 8  | 31 | 33 | 3  | 22 | 14 | 17 | 15 | 4  | 4  | 27 |    |
| 29 | 25 | 22 | 30 | 4  | 0  | 8  | 34 | 33 | 31 | 22 | 3  | 17 | 14 | 4  | 15 | 27 | 4  | 28 |

-continued

|   |    |    |    |    |    |    |    |    |    |    |     |
|---|----|----|----|----|----|----|----|----|----|----|-----|
| 9 | 12 | 17 |  3 | 29 | 28 |    |  0 |    |    | 13 |     |
|18 | 17 | 12 | 29 |  3 |    | 28 |    |  0 | 13 |    |     |
|28 | 14 | 20 | 27 | 18 | 13 | 24 | 13 | 23 | 22 |    | 24  |
|   | 20 | 14 | 18 | 27 | 24 | 13 | 23 | 13 |    | 22 | 24. |

6. A system, comprising:

a processor a non-transitory memory connected to the processor and storing instructions configuring the processor to cause the system to perform the method of:

receiving a 1×K source word row vector $\bar{u}$; and generating a 1×N codeword vector $\bar{c}=\bar{u}\cdot G$, wherein G is a K×N generator matrix derived from a parity check matrix $H_I$; and wherein $H_I$ is derived from a base parity check matrix H by applying an optimized lifting matrix to the base parity check matrix $H_I$ the optimized lifting matrix being either:

| 1 | 1 | 0 | 0 | 0 | 0 | 1 | 1 | 0 | 1 | 0 | 0 |   |   |   |
|---|---|---|---|---|---|---|---|---|---|---|---|---|---|---|
| 1 | 0 | 0 | 1 | 1 | 1 | 1 | 1 | 1 | 1 | 0 | 1 | 1 |   |   |
| 0 | 0 | 1 | 1 | 1 | 1 | 0 | 0 | 1 | 0 | 1 |   | 0 | 1 |   |
| 0 | 1 | 1 | 0 | 0 | 0 | 0 | 0 |   | 0 | 1 | 0 | 0 | 0 | 0 | or:

| 0 | 0 | 0 | 1 | 1 | 0 | 0 | 0 | 1 | 0 | 0 | 1 |   |   |   |
|---|---|---|---|---|---|---|---|---|---|---|---|---|---|---|
| 1 | 1 | 0 | 0 | 1 | 0 | 1 | 0 | 1 | 0 | 0 | 0 | 1 |   |   |
| 0 | 1 | 1 | 0 | 1 | 1 | 0 | 0 | 1 | 0 | 0 |   | 1 | 0 |   |
| 0 | 1 | 0 | 1 | 0 | 0 | 0 | 0 |   | 0 | 0 | 0 | 0 | 0 | 1 |

\* \* \* \* \*